United States Patent
Yeung et al.

(10) Patent No.: US 11,129,295 B1
(45) Date of Patent: *Sep. 21, 2021

(54) ENCLOSURE ASSEMBLY FOR ENHANCED COOLING OF DIRECT DRIVE UNIT AND RELATED METHODS

(71) Applicant: BJ Energy Solutions, LLC, Houston, TX (US)

(72) Inventors: Tony Yeung, Houston, TX (US); Ricardo Rodriguez-Ramon, Houston, TX (US); Guillermo Rodriguez, Houston, TX (US)

(73) Assignee: BJ Energy Solutions, LLC, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/356,063

(22) Filed: Jun. 23, 2021

Related U.S. Application Data

(62) Division of application No. 17/302,039, filed on Apr. 22, 2021.

(Continued)

(51) Int. Cl.
*H05K 7/20* (2006.01)
*E21B 43/26* (2006.01)

(52) U.S. Cl.
CPC ......... *H05K 7/20154* (2013.01); *E21B 43/26* (2013.01); *H05K 7/20145* (2013.01); *H05K 7/20209* (2013.01)

(58) Field of Classification Search
CPC .... E21B 43/26; E21B 43/267; E21B 43/2607; E21B 41/0085; E21B 43/00; E21B 23/08;

(Continued)

(56) References Cited

U.S. PATENT DOCUMENTS

| 2,498,229 A | 2/1950 | Adler |
| 3,068,796 A | 12/1962 | Pfluger et al. |

(Continued)

FOREIGN PATENT DOCUMENTS

| CA | 2829762 | 9/2012 |
| CA | 2876687 A1 | 5/2014 |

(Continued)

OTHER PUBLICATIONS

ResearchGate, Answer by Byron Woolridge, found at https://www.researchgate.net/post/How_can_we_improve_the_efficiency_of_the_gas_turbine_cycles, Jan. 1, 2013.

(Continued)

*Primary Examiner* — Mandeep S Buttar
(74) *Attorney, Agent, or Firm* — Womble Bond Dickinson (US) LLP

(57) ABSTRACT

Embodiments of an enclosure assembly to enhance cooling of a hydraulic fracturing direct drive unit (DDU) during operation are included. The enclosure assembly may include an enclosure body extending at least partially around an enclosure space to house the DDU for driving a fluid pump. The enclosure assembly may include one or more heat exchanger assemblies connected to the enclosure body for cooling a process fluid associated with one or more of the DDU and the fluid pump, and which may be configured to draw air into the enclosure space from and external environment, toward one or more radiator assemblies to cool the process fluid, and along an airflow path through the enclosure space. One or more outlet fan assemblies may be operative to discharge air from the enclosure space to the external environment to maintain a desired temperature of the enclosure space.

20 Claims, 12 Drawing Sheets

Related U.S. Application Data

(60) Provisional application No. 62/705,042, filed on Jun. 9, 2020, provisional application No. 62/704,981, filed on Jun. 5, 2020.

(58) Field of Classification Search
CPC .......... E21B 47/06; F04B 17/03; F04B 49/20; F05D 2240/24; H05K 7/20154; H05K 7/20145; H05K 7/20209
USPC .......................... 361/695; 166/250.01, 308.1
See application file for complete search history.

(56) References Cited

U.S. PATENT DOCUMENTS

| | | |
|---|---|---|
| 3,191,517 A | 6/1965 | Solzman |
| 3,257,031 A | 6/1966 | Dietz |
| 3,378,074 A | 4/1968 | Kiel |
| 3,550,696 A | 12/1970 | Kenneday |
| 3,739,872 A | 6/1973 | McNair |
| 3,773,438 A | 11/1973 | Hall et al. |
| 3,786,835 A | 1/1974 | Finger |
| 3,791,682 A | 2/1974 | Mitchell |
| 3,796,045 A | 3/1974 | Foster |
| 3,820,922 A | 6/1974 | Buse et al. |
| 4,010,613 A | 3/1977 | McInerney |
| 4,031,407 A | 6/1977 | Reed |
| 4,086,976 A | 5/1978 | Holm et al. |
| 4,204,808 A | 5/1980 | Reese et al. |
| 4,222,229 A | 9/1980 | Uram |
| 4,269,569 A | 5/1981 | Hoover |
| 4,311,395 A | 1/1982 | Douthitt et al. |
| 4,330,237 A | 5/1982 | Battah |
| 4,357,027 A | 11/1982 | Zeitlow |
| 4,402,504 A | 9/1983 | Christian |
| 4,457,325 A | 7/1984 | Green |
| 4,470,771 A | 9/1984 | Hall et al. |
| 4,483,684 A | 11/1984 | Black |
| 4,574,880 A | 3/1986 | Handke |
| 4,584,654 A | 4/1986 | Crane |
| 4,754,607 A | 7/1988 | Mackay |
| 4,782,244 A | 11/1988 | Wakimoto |
| 4,796,777 A | 1/1989 | Keller |
| 4,913,625 A | 4/1990 | Gerlowski |
| 4,983,259 A | 1/1991 | Duncan |
| 4,990,058 A | 2/1991 | Eslinger |
| 5,135,361 A | 8/1992 | Dion |
| 5,537,813 A | 7/1996 | Davis et al. |
| 5,553,514 A | 9/1996 | Walkowc |
| 5,560,195 A | 10/1996 | Anderson et al. |
| 5,586,444 A | 12/1996 | Fung |
| 5,622,245 A | 4/1997 | Reik |
| 5,651,400 A | 7/1997 | Corts et al. |
| 5,678,460 A | 10/1997 | Walkowc |
| 5,717,172 A | 2/1998 | Griffin, Jr. et al. |
| 5,983,962 A | 11/1999 | Gerardot |
| 6,041,856 A | 3/2000 | Thrasher et al. |
| 6,050,080 A | 4/2000 | Horner |
| 6,071,188 A | 6/2000 | O'Neill et al. |
| 6,074,170 A | 6/2000 | Bert et al. |
| 6,123,751 A | 9/2000 | Nelson et al. |
| 6,129,335 A | 10/2000 | Yokogi |
| 6,145,318 A | 11/2000 | Kaplan et al. |
| 6,230,481 B1 | 5/2001 | Jahr |
| 6,279,309 B1 | 8/2001 | Lawlor, II et al. |
| 6,321,860 B1 | 11/2001 | Reddoch |
| 6,334,746 B1 | 1/2002 | Nguyen et al. |
| 6,530,224 B1 | 3/2003 | Conchieri |
| 6,543,395 B2 | 4/2003 | Green |
| 6,655,922 B1 | 12/2003 | Flek |
| 6,765,304 B2 | 7/2004 | Baten et al. |
| 6,786,051 B2 | 9/2004 | Kristich et al. |
| 6,851,514 B2 | 2/2005 | Han et al. |
| 6,859,740 B2 | 2/2005 | Stephenson et al. |
| 6,901,735 B2 | 6/2005 | Lohn |
| 7,065,953 B1 | 6/2006 | Kopko |
| 7,143,016 B1 | 11/2006 | Discenzo et al. |
| 7,222,015 B2 | 5/2007 | Davis et al. |
| 7,388,303 B2 | 6/2008 | Seiver |
| 7,545,130 B2 | 6/2009 | Latham |
| 7,552,903 B2 | 6/2009 | Dunn et al. |
| 7,563,076 B2 | 7/2009 | Brunet et al. |
| 7,627,416 B2 | 12/2009 | Batenburg et al. |
| 7,677,316 B2 | 3/2010 | Butler et al. |
| 7,721,521 B2 | 5/2010 | Kunkle et al. |
| 7,730,711 B2 | 6/2010 | Kunkle et al. |
| 7,845,413 B2 | 12/2010 | Shampine et al. |
| 7,900,724 B2 | 3/2011 | Promersberger et al. |
| 7,921,914 B2 | 4/2011 | Bruins et al. |
| 7,938,151 B2 | 5/2011 | Höckner |
| 7,980,357 B2 | 7/2011 | Edwards |
| 8,083,504 B2 | 12/2011 | Williams et al. |
| 8,186,334 B2 | 5/2012 | Ooyama |
| 8,196,555 B2 | 6/2012 | Ikeda et al. |
| 8,316,936 B2 | 11/2012 | Roddy et al. |
| 8,414,673 B2 | 4/2013 | Raje et al. |
| 8,506,267 B2 | 8/2013 | Gambier et al. |
| 8,575,873 B2 | 11/2013 | Peterson et al. |
| 8,616,005 B1 | 12/2013 | Cousino, Sr. et al. |
| 8,621,873 B2 | 1/2014 | Robertson et al. |
| 8,672,606 B2 | 3/2014 | Glynn et al. |
| 8,714,253 B2 | 5/2014 | Sherwood et al. |
| 8,770,329 B2 | 7/2014 | Spitler |
| 8,789,601 B2 | 7/2014 | Broussard et al. |
| 8,794,307 B2 | 8/2014 | Coquilleau et al. |
| 8,801,394 B2 | 8/2014 | Anderson |
| 8,851,441 B2 | 10/2014 | Acuna et al. |
| 8,905,056 B2 | 12/2014 | Kendrick |
| 8,973,560 B2 | 3/2015 | Krug |
| 8,997,904 B2 | 4/2015 | Cryer et al. |
| 9,032,620 B2 | 5/2015 | Frassinelli et al. |
| 9,057,247 B2 | 6/2015 | Kumar et al. |
| 9,103,193 B2 | 8/2015 | Coli et al. |
| 9,121,257 B2 | 9/2015 | Coli et al. |
| 9,140,110 B2 | 9/2015 | Coli et al. |
| 9,187,982 B2 | 11/2015 | Dehring et al. |
| 9,212,643 B2 | 12/2015 | Deliyski |
| 9,222,346 B1 | 12/2015 | Walls |
| 9,341,055 B2 | 5/2016 | Weightman et al. |
| 9,346,662 B2 | 5/2016 | Van Vliet et al. |
| 9,366,114 B2 | 6/2016 | Coli et al. |
| 9,376,786 B2 | 6/2016 | Numasawa |
| 9,394,829 B2 | 7/2016 | Cabeen et al. |
| 9,395,049 B2 | 7/2016 | Vicknair et al. |
| 9,401,670 B2 | 7/2016 | Minato et al. |
| 9,410,410 B2 | 8/2016 | Broussard et al. |
| 9,410,546 B2 | 8/2016 | Jaeger et al. |
| 9,429,078 B1 | 8/2016 | Crowe et al. |
| 9,488,169 B2 | 11/2016 | Cochran et al. |
| 9,493,997 B2 | 11/2016 | Liu et al. |
| 9,512,783 B2 | 12/2016 | Veilleux et al. |
| 9,534,473 B2 | 1/2017 | Morris et al. |
| 9,546,652 B2 | 1/2017 | Yin |
| 9,550,501 B2 | 1/2017 | Ledbetter |
| 9,556,721 B2 | 1/2017 | Jang et al. |
| 9,562,420 B2 | 2/2017 | Morris et al. |
| 9,570,945 B2 | 2/2017 | Fischer |
| 9,579,980 B2 | 2/2017 | Cryer et al. |
| 9,587,649 B2 | 3/2017 | Oehring |
| 9,611,728 B2 | 4/2017 | Oehring |
| 9,617,808 B2 | 4/2017 | Liu et al. |
| 9,638,101 B1 | 5/2017 | Crowe et al. |
| 9,638,194 B2 | 5/2017 | Wiegman et al. |
| 9,650,871 B2 | 5/2017 | Oehring et al. |
| 9,656,762 B2 | 5/2017 | Kamath et al. |
| 9,689,316 B1 | 6/2017 | Crom |
| 9,739,130 B2 | 8/2017 | Young |
| 9,764,266 B1 | 9/2017 | Carter |
| 9,777,748 B2 | 10/2017 | Lu et al. |
| 9,803,467 B2 | 10/2017 | Tang et al. |
| 9,803,793 B2 | 10/2017 | Davi et al. |
| 9,809,308 B2 | 11/2017 | Aguilar et al. |
| 9,829,002 B2 | 11/2017 | Crom |
| 9,840,897 B2 | 12/2017 | Larson |
| 9,840,901 B2 | 12/2017 | Oering et al. |

(56) References Cited

U.S. PATENT DOCUMENTS

| | | |
|---|---|---|
| 9,850,422 B2 | 12/2017 | Lestz et al. |
| 9,856,131 B1 | 1/2018 | Moffitt |
| 9,863,279 B2 | 1/2018 | Laing et al. |
| 9,869,305 B1 | 1/2018 | Crowe et al. |
| 9,879,609 B1 | 1/2018 | Crowe et al. |
| 9,893,500 B2 | 2/2018 | Oehring et al. |
| 9,893,660 B2 | 2/2018 | Peterson et al. |
| 9,920,615 B2 | 3/2018 | Zhang et al. |
| 9,945,365 B2 | 4/2018 | Hernandez et al. |
| 9,964,052 B2 | 5/2018 | Millican et al. |
| 9,970,278 B2 | 5/2018 | Broussard et al. |
| 9,981,840 B2 | 5/2018 | Shock |
| 9,995,102 B2 | 6/2018 | Dillie et al. |
| 9,995,218 B2 | 6/2018 | Oehring et al. |
| 10,008,880 B2 | 6/2018 | Vicknair et al. |
| 10,008,912 B2 | 6/2018 | Davey et al. |
| 10,018,096 B2 | 7/2018 | Wallimann et al. |
| 10,020,711 B2 | 7/2018 | Oehring et al. |
| 10,024,123 B2 | 7/2018 | Steffenhagen et al. |
| 10,029,289 B2 | 7/2018 | Wendorski et al. |
| 10,030,579 B2 | 7/2018 | Austin et al. |
| 10,036,238 B2 | 7/2018 | Oehring |
| 10,040,541 B2 | 8/2018 | Wilson et al. |
| 10,060,349 B2 | 8/2018 | Alvarez et al. |
| 10,082,137 B2 | 9/2018 | Graham et al. |
| 10,094,366 B2 | 10/2018 | Marica |
| 10,100,827 B2 | 10/2018 | Devan et al. |
| 10,107,084 B2 | 10/2018 | Coli et al. |
| 10,107,085 B2 | 10/2018 | Coli et al. |
| 10,114,061 B2 | 10/2018 | Frampton et al. |
| 10,119,381 B2 | 11/2018 | Oehring et al. |
| 10,134,257 B2 | 11/2018 | Zhang et al. |
| 10,138,098 B2 | 11/2018 | Sorensen et al. |
| 10,151,244 B2 | 12/2018 | Giancotti et al. |
| 10,174,599 B2 | 1/2019 | Shampine et al. |
| 10,184,397 B2 | 1/2019 | Austin et al. |
| 10,196,258 B2 | 2/2019 | Kalala et al. |
| 10,221,856 B2 | 3/2019 | Hernandez et al. |
| 10,227,854 B2 | 3/2019 | Glass |
| 10,227,855 B2 | 3/2019 | Coli et al. |
| 10,246,984 B2 | 4/2019 | Payne et al. |
| 10,247,182 B2 | 4/2019 | Zhang et al. |
| 10,254,732 B2 | 4/2019 | Oehring et al. |
| 10,267,439 B2 | 4/2019 | Pryce et al. |
| 10,280,724 B2 | 5/2019 | Hinderliter |
| 10,287,943 B1 | 5/2019 | Schiltz |
| 10,303,190 B2 | 5/2019 | Shock |
| 10,316,832 B2 | 6/2019 | Byrne |
| 10,317,875 B2 | 6/2019 | Pandurangan |
| 10,337,402 B2 | 7/2019 | Austin et al. |
| 10,358,035 B2 | 7/2019 | Cryer |
| 10,371,012 B2 | 8/2019 | Davis et al. |
| 10,374,485 B2 | 8/2019 | Morris et al. |
| 10,378,326 B2 | 8/2019 | Morris et al. |
| 10,393,108 B2 | 8/2019 | Chong et al. |
| 10,407,990 B2 | 9/2019 | Oehring et al. |
| 10,408,031 B2 | 9/2019 | Oehring et al. |
| 10,415,348 B2 | 9/2019 | Zhang et al. |
| 10,415,557 B1 | 9/2019 | Crowe et al. |
| 10,415,562 B2 | 9/2019 | Kajita et al. |
| RE47,695 E | 11/2019 | Case et al. |
| 10,465,689 B2 | 11/2019 | Crom |
| 10,478,753 B1 | 11/2019 | Elms et al. |
| 10,526,882 B2 | 1/2020 | Oehring et al. |
| 10,563,649 B2 | 2/2020 | Zhang et al. |
| 10,577,910 B2 | 3/2020 | Stephenson |
| 10,598,258 B2 | 3/2020 | Oehring et al. |
| 10,610,842 B2 | 4/2020 | Chong |
| 10,711,787 B1 | 7/2020 | Darley |
| 10,738,580 B1 | 8/2020 | Fischer et al. |
| 10,753,153 B1 | 8/2020 | Fischer et al. |
| 10,753,165 B1 | 8/2020 | Fischer et al. |
| 10,794,165 B2 | 10/2020 | Fischer et al. |
| 10,794,166 B2 | 10/2020 | Reckels et al. |
| 10,801,311 B1 | 10/2020 | Cui et al. |
| 10,815,764 B1 | 10/2020 | Yeung et al. |
| 10,815,978 B2 | 10/2020 | Glass |
| 10,830,032 B1 | 11/2020 | Zhang et al. |
| 10,865,624 B1 | 12/2020 | Cui et al. |
| 10,865,631 B1 | 12/2020 | Zhang et al. |
| 10,895,202 B1 | 1/2021 | Yeung et al. |
| 10,907,459 B1 | 2/2021 | Yeung et al. |
| 10,927,774 B2 | 2/2021 | Cai et al. |
| 10,954,770 B1 | 3/2021 | Yeung et al. |
| 10,961,908 B1 | 3/2021 | Yeung et al. |
| 10,961,912 B1 | 3/2021 | Yeung et al. |
| 10,961,914 B1 | 3/2021 | Yeung et al. |
| 10,982,523 B1 | 4/2021 | Hill et al. |
| 10,989,019 B2 | 4/2021 | Cai et al. |
| 10,995,564 B2 | 5/2021 | Miller et al. |
| 11,035,214 B2 | 6/2021 | Cui et al. |
| 11,053,853 B2 | 7/2021 | Li et al. |
| 2004/0016245 A1 | 1/2004 | Pierson |
| 2004/0187950 A1 | 9/2004 | Cohen et al. |
| 2005/0139286 A1 | 6/2005 | Poulter |
| 2005/0226754 A1 | 10/2005 | Orr et al. |
| 2006/0061091 A1 | 3/2006 | Osterloh |
| 2006/0062914 A1 | 3/2006 | Garg et al. |
| 2006/0260331 A1 | 11/2006 | Andreychuk |
| 2007/0029090 A1 | 2/2007 | Andreychuk et al. |
| 2007/0066406 A1 | 3/2007 | Keller et al. |
| 2007/0107981 A1 | 5/2007 | Sicotte |
| 2007/0125544 A1 | 6/2007 | Robinson et al. |
| 2007/0181212 A1 | 8/2007 | Fell |
| 2007/0277982 A1 | 12/2007 | Shampine et al. |
| 2007/0295569 A1 | 12/2007 | Manzoor et al. |
| 2008/0098891 A1 | 5/2008 | Feher |
| 2008/0161974 A1 | 7/2008 | Alston |
| 2008/0264625 A1 | 10/2008 | Ochoa |
| 2008/0264649 A1 | 10/2008 | Crawford |
| 2009/0064685 A1 | 3/2009 | Busekros et al. |
| 2009/0124191 A1 | 5/2009 | Van Becelaere et al. |
| 2010/0071899 A1 | 3/2010 | Coquilleau et al. |
| 2010/0218508 A1 | 9/2010 | Brown et al. |
| 2010/0300683 A1 | 12/2010 | Looper et al. |
| 2010/0310384 A1 | 12/2010 | Stephenson et al. |
| 2011/0052423 A1 | 3/2011 | Gambier et al. |
| 2011/0054704 A1 | 3/2011 | Karpman et al. |
| 2011/0085924 A1 | 4/2011 | Shampine et al. |
| 2011/0197988 A1 | 8/2011 | Van Vliet et al. |
| 2011/0241888 A1 | 10/2011 | Lu et al. |
| 2011/0265443 A1 | 11/2011 | Ansari |
| 2011/0272158 A1 | 11/2011 | Neal |
| 2012/0048242 A1 | 3/2012 | Sumilla et al. |
| 2012/0199001 A1 | 8/2012 | Chillar et al. |
| 2012/0310509 A1 | 12/2012 | Pardo et al. |
| 2013/0068307 A1 | 3/2013 | Hains et al. |
| 2013/0087045 A1 | 4/2013 | Sullivan et al. |
| 2013/0087945 A1 | 4/2013 | Kusters et al. |
| 2013/0259707 A1 | 10/2013 | Yin |
| 2013/0284455 A1 | 10/2013 | Kajaria et al. |
| 2013/0300341 A1 | 11/2013 | Gillette |
| 2013/0306322 A1 | 11/2013 | Sanborn |
| 2014/0013768 A1 | 1/2014 | Laing et al. |
| 2014/0044517 A1 | 2/2014 | Saha et al. |
| 2014/0048253 A1 | 2/2014 | Andreychuk |
| 2014/0090742 A1 | 4/2014 | Coskrey et al. |
| 2014/0094105 A1 | 4/2014 | Lundh et al. |
| 2014/0130422 A1 | 5/2014 | Laing et al. |
| 2014/0147291 A1 | 5/2014 | Burnette |
| 2014/0216736 A1 | 8/2014 | Leugemors et al. |
| 2014/0277772 A1 | 9/2014 | Lopez et al. |
| 2014/0290266 A1 | 10/2014 | Veilleux, Jr. et al. |
| 2014/0318638 A1 | 10/2014 | Harwood et al. |
| 2015/0078924 A1 | 3/2015 | Zhang et al. |
| 2015/0101344 A1 | 4/2015 | Jarrier et al. |
| 2015/0114652 A1 | 4/2015 | Lestz et al. |
| 2015/0129210 A1 | 5/2015 | Chong et al. |
| 2015/0135659 A1 | 5/2015 | Jarrier et al. |
| 2015/0159553 A1 | 6/2015 | Kippel et al. |
| 2015/0192117 A1 | 7/2015 | Bridges |
| 2015/0204148 A1 | 7/2015 | Liu et al. |
| 2015/0204322 A1 | 7/2015 | Iund et al. |
| 2015/0211512 A1 | 7/2015 | Wiegman et al. |

(56) References Cited

U.S. PATENT DOCUMENTS

| | | |
|---|---|---|
| 2015/0217672 A1 | 8/2015 | Shampine et al. |
| 2015/0252661 A1 | 9/2015 | Glass |
| 2015/0275891 A1 | 10/2015 | Chong et al. |
| 2015/0340864 A1 | 11/2015 | Compton |
| 2015/0345385 A1 | 12/2015 | Santini |
| 2015/0369351 A1 | 12/2015 | Hermann et al. |
| 2016/0032703 A1 | 2/2016 | Broussard et al. |
| 2016/0102581 A1 | 4/2016 | Del Bono |
| 2016/0105022 A1 | 4/2016 | Oehring et al. |
| 2016/0108713 A1 | 4/2016 | Dunaeva et al. |
| 2016/0177675 A1 | 6/2016 | Morris et al. |
| 2016/0186671 A1 | 6/2016 | Austin et al. |
| 2016/0215774 A1 | 7/2016 | Oklejas et al. |
| 2016/0230525 A1 | 8/2016 | Lestz et al. |
| 2016/0244314 A1 | 8/2016 | Van Vliet et al. |
| 2016/0248230 A1 | 8/2016 | Tawy et al. |
| 2016/0253634 A1 | 9/2016 | Thomeer et al. |
| 2016/0258267 A1 | 9/2016 | Payne et al. |
| 2016/0273346 A1 | 9/2016 | Tang et al. |
| 2016/0290114 A1 | 10/2016 | Oehring et al. |
| 2016/0319650 A1 | 11/2016 | Oehring et al. |
| 2016/0348479 A1 | 12/2016 | Oehring et al. |
| 2016/0369609 A1 | 12/2016 | Morris et al. |
| 2017/0009905 A1 | 1/2017 | Arnold |
| 2017/0016433 A1 | 1/2017 | Chong et al. |
| 2017/0030177 A1 | 2/2017 | Oehring et al. |
| 2017/0038137 A1 | 2/2017 | Turney |
| 2017/0074076 A1 | 3/2017 | Joseph et al. |
| 2017/0082110 A1 | 3/2017 | Lammers |
| 2017/0089189 A1 | 3/2017 | Norris et al. |
| 2017/0145918 A1 | 5/2017 | Oehring et al. |
| 2017/0191350 A1 | 7/2017 | Johns et al. |
| 2017/0218727 A1 | 8/2017 | Oehring et al. |
| 2017/0226839 A1 | 8/2017 | Broussard et al. |
| 2017/0226998 A1 | 8/2017 | Zhang et al. |
| 2017/0227002 A1 | 8/2017 | Mikulski et al. |
| 2017/0234165 A1 | 8/2017 | Kersey et al. |
| 2017/0234308 A1 | 8/2017 | Buckley |
| 2017/0248034 A1 | 8/2017 | Dzieciol et al. |
| 2017/0275149 A1 | 9/2017 | Schmidt |
| 2017/0292409 A1 | 10/2017 | Aguilar et al. |
| 2017/0302135 A1 | 10/2017 | Cory |
| 2017/0305736 A1 | 10/2017 | Haile et al. |
| 2017/0322086 A1 | 11/2017 | Luharuka |
| 2017/0334448 A1 | 11/2017 | Schwunk |
| 2017/0335842 A1 | 11/2017 | Robinson et al. |
| 2017/0350471 A1 | 12/2017 | Steidl et al. |
| 2017/0370199 A1 | 12/2017 | Witkowski et al. |
| 2017/0370480 A1 | 12/2017 | Witkowski et al. |
| 2018/0034280 A1 | 2/2018 | Pedersen |
| 2018/0038328 A1 | 2/2018 | Louven et al. |
| 2018/0041093 A1 | 2/2018 | Miranda |
| 2018/0045202 A1 | 2/2018 | Crom |
| 2018/0038216 A1 | 3/2018 | Zhang et al. |
| 2018/0058171 A1 | 3/2018 | Roesner et al. |
| 2018/0156210 A1 | 6/2018 | Oehring et al. |
| 2018/0172294 A1 | 6/2018 | Owen |
| 2018/0183219 A1 | 6/2018 | Oehring et al. |
| 2018/0186442 A1 | 7/2018 | Maier |
| 2018/0187662 A1 | 7/2018 | Hill et al. |
| 2018/0209415 A1 | 7/2018 | Zhang et al. |
| 2018/0223640 A1 | 8/2018 | Keihany et al. |
| 2018/0224044 A1 | 8/2018 | Penney |
| 2018/0229998 A1 | 8/2018 | Shock |
| 2018/0258746 A1 | 9/2018 | Broussard et al. |
| 2018/0266412 A1 | 9/2018 | Stokkevag et al. |
| 2018/0278124 A1 | 9/2018 | Oehring et al. |
| 2018/0283102 A1 | 10/2018 | Cook |
| 2018/0283618 A1 | 10/2018 | Cook |
| 2018/0284817 A1 | 10/2018 | Cook et al. |
| 2018/0290877 A1 | 10/2018 | Shock |
| 2018/0291781 A1 | 10/2018 | Pedrini |
| 2018/0298731 A1 | 10/2018 | Bishop |
| 2018/0298735 A1 | 10/2018 | Conrad |
| 2018/0307255 A1 | 10/2018 | Bishop |
| 2018/0328157 A1* | 11/2018 | Bishop .................... E21B 43/26 |
| 2018/0334893 A1 | 11/2018 | Oehring |
| 2018/0363435 A1 | 12/2018 | Coli et al. |
| 2018/0363436 A1 | 12/2018 | Coli et al. |
| 2018/0363437 A1 | 12/2018 | Coli et al. |
| 2018/0363438 A1 | 12/2018 | Coli et al. |
| 2019/0003272 A1 | 1/2019 | Morris et al. |
| 2019/0003329 A1 | 1/2019 | Morris et al. |
| 2019/0010793 A1 | 1/2019 | Hinderliter |
| 2019/0011051 A1 | 1/2019 | Yeung |
| 2019/0063341 A1 | 2/2019 | Davis |
| 2019/0067991 A1 | 2/2019 | Davis et al. |
| 2019/0071992 A1 | 3/2019 | Feng |
| 2019/0072005 A1 | 3/2019 | Fisher et al. |
| 2019/0078471 A1 | 3/2019 | Braglia et al. |
| 2019/0091619 A1 | 3/2019 | Huang |
| 2019/0106316 A1 | 4/2019 | Van Vliet et al. |
| 2019/0106970 A1 | 4/2019 | Oehring |
| 2019/0112908 A1 | 4/2019 | Coli et al. |
| 2019/0112910 A1 | 4/2019 | Oehring et al. |
| 2019/0119096 A1 | 4/2019 | Haile et al. |
| 2019/0120024 A1 | 4/2019 | Oehring et al. |
| 2019/0120031 A1 | 4/2019 | Gilje |
| 2019/0120134 A1 | 4/2019 | Goleczka et al. |
| 2019/0128247 A1 | 5/2019 | Douglas, III |
| 2019/0128288 A1 | 5/2019 | Konada et al. |
| 2019/0131607 A1 | 5/2019 | Gillette |
| 2019/0136677 A1 | 5/2019 | Shampine et al. |
| 2019/0153843 A1 | 5/2019 | Headrick |
| 2019/0154020 A1 | 5/2019 | Glass |
| 2019/0264667 A1 | 5/2019 | Byrne |
| 2019/0178234 A1 | 6/2019 | Beisel |
| 2019/0178235 A1 | 6/2019 | Coskrey et al. |
| 2019/0185312 A1 | 6/2019 | Bush et al. |
| 2019/0203572 A1 | 7/2019 | Morris et al. |
| 2019/0204021 A1 | 7/2019 | Morris et al. |
| 2019/0211814 A1 | 7/2019 | Weightman et al. |
| 2019/0217258 A1 | 7/2019 | Bishop |
| 2019/0226317 A1 | 7/2019 | Payne et al. |
| 2019/0245348 A1 | 8/2019 | Hinderliter et al. |
| 2019/0249652 A1 | 8/2019 | Stephenson et al. |
| 2019/0249754 A1 | 8/2019 | Oehring et al. |
| 2019/0257297 A1 | 8/2019 | Botting et al. |
| 2019/0277295 A1 | 9/2019 | Clyburn et al. |
| 2019/0309585 A1 | 10/2019 | Miller et al. |
| 2019/0316447 A1 | 10/2019 | Oehring et al. |
| 2019/0316456 A1 | 10/2019 | Beisel et al. |
| 2019/0323337 A1 | 10/2019 | Glass et al. |
| 2019/0330923 A1 | 10/2019 | Gable et al. |
| 2019/0331117 A1 | 10/2019 | Gable et al. |
| 2019/0338762 A1 | 11/2019 | Curry et al. |
| 2019/0345920 A1 | 11/2019 | Surjaatmadja et al. |
| 2019/0356199 A1 | 11/2019 | Morris et al. |
| 2019/0376449 A1 | 12/2019 | Carrell |
| 2020/0003205 A1 | 1/2020 | Stokkevåg et al. |
| 2020/0011165 A1 | 1/2020 | George et al. |
| 2020/0040878 A1 | 2/2020 | Morris |
| 2020/0049136 A1 | 2/2020 | Stephenson |
| 2020/0049153 A1 | 2/2020 | Headrick et al. |
| 2020/0071998 A1 | 3/2020 | Oehring et al. |
| 2020/0072201 A1 | 3/2020 | Marica |
| 2020/0088202 A1 | 3/2020 | Sigmar et al. |
| 2020/0095854 A1 | 3/2020 | Hinderliter |
| 2020/0132058 A1 | 4/2020 | Mollatt |
| 2020/0141219 A1 | 5/2020 | Oehring et al. |
| 2020/0141907 A1 | 5/2020 | Meck et al. |
| 2020/0166026 A1 | 5/2020 | Marica |
| 2020/0206704 A1 | 7/2020 | Chong |
| 2020/0224645 A1 | 7/2020 | Buckley |
| 2020/0256333 A1 | 8/2020 | Surjaatmadja |
| 2020/0263498 A1 | 8/2020 | Fischer et al. |
| 2020/0263525 A1 | 8/2020 | Reid |
| 2020/0263526 A1 | 8/2020 | Fischer et al. |
| 2020/0263527 A1 | 8/2020 | Fischer et al. |
| 2020/0263528 A1 | 8/2020 | Fischer et al. |
| 2020/0267888 A1 | 8/2020 | Putz |
| 2020/0291731 A1 | 9/2020 | Haiderer et al. |
| 2020/0309113 A1 | 10/2020 | Hunter et al. |
| 2020/0325752 A1 | 10/2020 | Clark et al. |

(56) References Cited

U.S. PATENT DOCUMENTS

| | | |
|---|---|---|
| 2020/0325760 A1 | 10/2020 | Markham |
| 2020/0325761 A1 | 10/2020 | Williams |
| 2020/0325893 A1 | 10/2020 | Kraige et al. |
| 2020/0332784 A1 | 10/2020 | Zhang et al. |
| 2020/0332788 A1 | 10/2020 | Cui et al. |
| 2020/0340313 A1 | 10/2020 | Fischer et al. |
| 2020/0340340 A1 | 10/2020 | Oehring et al. |
| 2020/0340344 A1 | 10/2020 | Reckels et al. |
| 2020/0340404 A1 | 10/2020 | Stockstill |
| 2020/0347725 A1 | 11/2020 | Morris et al. |
| 2020/0340322 A1 | 12/2020 | Sizemore et al. |
| 2020/0392826 A1 | 12/2020 | Cui et al. |
| 2020/0392827 A1 | 12/2020 | George et al. |
| 2020/0393088 A1 | 12/2020 | Sizemore et al. |
| 2020/0398238 A1 | 12/2020 | Zhong et al. |
| 2020/0400000 A1 | 12/2020 | Ghasripoor et al. |
| 2020/0400005 A1 | 12/2020 | Han et al. |
| 2020/0408071 A1 | 12/2020 | Li et al. |
| 2020/0408144 A1 | 12/2020 | Feng et al. |
| 2020/0408147 A1 | 12/2020 | Zhang et al. |
| 2021/0054727 A1 | 2/2021 | Floyd |
| 2021/0071574 A1 | 3/2021 | Feng et al. |
| 2021/0071579 A1 | 3/2021 | Li et al. |
| 2021/0071654 A1 | 3/2021 | Brunson |
| 2021/0071752 A1 | 3/2021 | Cui et al. |
| 2021/0123425 A1 | 4/2021 | Cui et al. |
| 2021/0123434 A1 | 4/2021 | Cui et al. |
| 2021/0123435 A1 | 4/2021 | Cui et al. |
| 2021/0131409 A1 | 5/2021 | Cui et al. |
| 2021/0156240 A1 | 5/2021 | Cicci et al. |
| 2021/0156241 A1 | 5/2021 | Cook |
| 2021/0172282 A1 | 6/2021 | Wang et al. |
| 2021/0180517 A1 | 6/2021 | Zhou et al. |

FOREIGN PATENT DOCUMENTS

| | | |
|---|---|---|
| CA | 2693567 | 9/2014 |
| CA | 2876687 C | 4/2019 |
| CA | 2919175 | 3/2021 |
| CN | 2779054 | 5/2006 |
| CN | 2890325 | 4/2007 |
| CN | 200964929 Y | 10/2007 |
| CN | 101323151 A | 12/2008 |
| CN | 201190660 Y | 2/2009 |
| CN | 201190892 Y | 2/2009 |
| CN | 201190893 Y | 2/2009 |
| CN | 101414171 A | 4/2009 |
| CN | 201215073 Y | 4/2009 |
| CN | 201236650 Y | 5/2009 |
| CN | 201275542 Y | 7/2009 |
| CN | 201275801 Y | 7/2009 |
| CN | 201333385 Y | 10/2009 |
| CN | 201443300 U | 4/2010 |
| CN | 201496415 U | 6/2010 |
| CN | 201501365 U | 6/2010 |
| CN | 201507271 U | 6/2010 |
| CN | 101323151 B | 7/2010 |
| CN | 201560210 U | 8/2010 |
| CN | 201581862 U | 9/2010 |
| CN | 201610728 U | 10/2010 |
| CN | 201610751 U | 10/2010 |
| CN | 201618530 U | 11/2010 |
| CN | 201661255 U | 12/2010 |
| CN | 101949382 | 1/2011 |
| CN | 201756927 U | 3/2011 |
| CN | 101414171 B | 5/2011 |
| CN | 102128011 A | 7/2011 |
| CN | 102140898 A | 8/2011 |
| CN | 102155172 A | 8/2011 |
| CN | 202000930 U | 10/2011 |
| CN | 202055781 U | 11/2011 |
| CN | 202082265 U | 12/2011 |
| CN | 202100216 U | 1/2012 |
| CN | 202100217 U | 1/2012 |
| CN | 202100815 U | 1/2012 |
| CN | 202124340 U | 1/2012 |
| CN | 202140051 U | 2/2012 |
| CN | 202140080 U | 2/2012 |
| CN | 202144789 U | 2/2012 |
| CN | 202144943 U | 2/2012 |
| CN | 202149354 U | 2/2012 |
| CN | 102383748 A | 3/2012 |
| CN | 202156297 U | 3/2012 |
| CN | 202158355 U | 3/2012 |
| CN | 202163504 U | 3/2012 |
| CN | 202165236 U | 3/2012 |
| CN | 202180866 U | 4/2012 |
| CN | 202181875 U | 4/2012 |
| CN | 202187744 U | 4/2012 |
| CN | 202191854 U | 4/2012 |
| CN | 202250008 U | 5/2012 |
| CN | 101885307 | 7/2012 |
| CN | 102562020 A | 7/2012 |
| CN | 202326156 U | 7/2012 |
| CN | 202370773 U | 8/2012 |
| CN | 202417397 U | 9/2012 |
| CN | 202417461 U | 9/2012 |
| CN | 102729335 A | 10/2012 |
| CN | 202463955 U | 10/2012 |
| CN | 202463957 U | 10/2012 |
| CN | 202467739 U | 10/2012 |
| CN | 202467801 U | 10/2012 |
| CN | 202531016 U | 11/2012 |
| CN | 202544794 U | 11/2012 |
| CN | 102825039 A | 12/2012 |
| CN | 202578592 U | 12/2012 |
| CN | 202579164 U | 12/2012 |
| CN | 202594808 U | 12/2012 |
| CN | 202594928 U | 12/2012 |
| CN | 202596615 U | 12/2012 |
| CN | 202596616 U | 12/2012 |
| CN | 102849880 A | 1/2013 |
| CN | 102889191 A | 1/2013 |
| CN | 202641535 U | 1/2013 |
| CN | 202645475 U | 1/2013 |
| CN | 202666716 U | 1/2013 |
| CN | 202669645 U | 1/2013 |
| CN | 202669944 U | 1/2013 |
| CN | 202671336 U | 1/2013 |
| CN | 202673269 U | 1/2013 |
| CN | 202751982 U | 2/2013 |
| CN | 102963629 A | 3/2013 |
| CN | 202767964 U | 3/2013 |
| CN | 202789791 U | 3/2013 |
| CN | 202789792 U | 3/2013 |
| CN | 202810717 U | 3/2013 |
| CN | 202827276 U | 3/2013 |
| CN | 202833093 U | 3/2013 |
| CN | 202833370 U | 3/2013 |
| CN | 102140898 B | 4/2013 |
| CN | 202895467 U | 4/2013 |
| CN | 202926404 U | 5/2013 |
| CN | 202935798 U | 5/2013 |
| CN | 202935816 U | 5/2013 |
| CN | 202970631 U | 6/2013 |
| CN | 103223315 A | 7/2013 |
| CN | 203050598 U | 7/2013 |
| CN | 103233714 A | 8/2013 |
| CN | 103233715 A | 8/2013 |
| CN | 103245523 A | 8/2013 |
| CN | 103247220 A | 8/2013 |
| CN | 103253839 A | 8/2013 |
| CN | 103277290 A | 9/2013 |
| CN | 103321782 A | 9/2013 |
| CN | 203170270 U | 9/2013 |
| CN | 203172509 U | 9/2013 |
| CN | 203175778 U | 9/2013 |
| CN | 203175787 U | 9/2013 |
| CN | 102849880 B | 10/2013 |
| CN | 203241231 U | 10/2013 |
| CN | 203244941 U | 10/2013 |
| CN | 203244942 U | 10/2013 |
| CN | 203303798 U | 11/2013 |
| CN | 102155172 B | 12/2013 |

(56) References Cited

FOREIGN PATENT DOCUMENTS

| | | | |
|---|---|---|---|
| CN | 102729335 B | 12/2013 |
| CN | 103420532 A | 12/2013 |
| CN | 203321792 U | 12/2013 |
| CN | 203412658   | 1/2014 |
| CN | 203420697 U | 2/2014 |
| CN | 203480755 U | 3/2014 |
| CN | 103711437 A | 4/2014 |
| CN | 203531815 U | 4/2014 |
| CN | 203531871 U | 4/2014 |
| CN | 203531883 U | 4/2014 |
| CN | 203556164 U | 4/2014 |
| CN | 203558809 U | 4/2014 |
| CN | 203559861 U | 4/2014 |
| CN | 203559893 U | 4/2014 |
| CN | 203560189 U | 4/2014 |
| CN | 102704870 B | 5/2014 |
| CN | 203611843 U | 5/2014 |
| CN | 203612531 U | 5/2014 |
| CN | 203612843 U | 5/2014 |
| CN | 203614062 U | 5/2014 |
| CN | 203614388 U | 5/2014 |
| CN | 203621045 U | 6/2014 |
| CN | 203621046 U | 6/2014 |
| CN | 203621051 U | 6/2014 |
| CN | 203640993 U | 6/2014 |
| CN | 203655221 U | 6/2014 |
| CN | 103899280 A | 7/2014 |
| CN | 103923670 A | 7/2014 |
| CN | 203685052 U | 7/2014 |
| CN | 203716936 U | 7/2014 |
| CN | 103990410 A | 8/2014 |
| CN | 103993869 A | 8/2014 |
| CN | 203754009 U | 8/2014 |
| CN | 203754025 U | 8/2014 |
| CN | 203754341 U | 8/2014 |
| CN | 203756614 U | 8/2014 |
| CN | 203770264 U | 8/2014 |
| CN | 203784519 U | 8/2014 |
| CN | 203784520 U | 8/2014 |
| CN | 104057864 A | 9/2014 |
| CN | 203819819 U | 9/2014 |
| CN | 203823431 U | 9/2014 |
| CN | 203835337 U | 9/2014 |
| CN | 104074500 A | 10/2014 |
| CN | 203876633 U | 10/2014 |
| CN | 203876636 U | 10/2014 |
| CN | 203877364 U | 10/2014 |
| CN | 203877365 U | 10/2014 |
| CN | 203877375 U | 10/2014 |
| CN | 203877424 U | 10/2014 |
| CN | 203879476 U | 10/2014 |
| CN | 203879479 U | 10/2014 |
| CN | 203890292 U | 10/2014 |
| CN | 203899476 U | 10/2014 |
| CN | 203906206 U | 10/2014 |
| CN | 104150728 A | 11/2014 |
| CN | 104176522 A | 12/2014 |
| CN | 104196464 A | 12/2014 |
| CN | 104234651 A | 12/2014 |
| CN | 203971841 U | 12/2014 |
| CN | 203975450 U | 12/2014 |
| CN | 204020788 U | 12/2014 |
| CN | 204021980 U | 12/2014 |
| CN | 204024625 U | 12/2014 |
| CN | 204051401 U | 12/2014 |
| CN | 204060661 U | 12/2014 |
| CN | 104260672 A | 1/2015 |
| CN | 104314512 A | 1/2015 |
| CN | 204077478 U | 1/2015 |
| CN | 204077526 U | 1/2015 |
| CN | 204078307 U | 1/2015 |
| CN | 204083051 U | 1/2015 |
| CN | 204113168 U | 1/2015 |
| CN | 104340682 A | 2/2015 |
| CN | 104358536 A | 2/2015 |
| CN | 104369687 A | 2/2015 |
| CN | 104402178 A | 3/2015 |
| CN | 104402185 A | 3/2015 |
| CN | 104402186 A | 3/2015 |
| CN | 204209819 U | 3/2015 |
| CN | 204224560 U | 3/2015 |
| CN | 204225813 U | 3/2015 |
| CN | 204225839 U | 3/2015 |
| CN | 104533392 A | 4/2015 |
| CN | 104563938 A | 4/2015 |
| CN | 104563994 A | 4/2015 |
| CN | 104563995 A | 4/2015 |
| CN | 104563998 A | 4/2015 |
| CN | 104564033 A | 4/2015 |
| CN | 204257122 U | 4/2015 |
| CN | 204283610 U | 4/2015 |
| CN | 204283782 U | 4/2015 |
| CN | 204297682 U | 4/2015 |
| CN | 204299810 U | 4/2015 |
| CN | 103223315 B | 5/2015 |
| CN | 104594857 A | 5/2015 |
| CN | 104595493 A | 5/2015 |
| CN | 104612647 A | 5/2015 |
| CN | 104612928 A | 5/2015 |
| CN | 104632126 A | 5/2015 |
| CN | 204325094 U | 5/2015 |
| CN | 204325098 U | 5/2015 |
| CN | 204326983 U | 5/2015 |
| CN | 204326985 U | 5/2015 |
| CN | 204344040 U | 5/2015 |
| CN | 204344095 U | 5/2015 |
| CN | 104727797 A | 6/2015 |
| CN | 204402414 U | 6/2015 |
| CN | 204402423 U | 6/2015 |
| CN | 204402450 U | 6/2015 |
| CN | 103247220 B | 7/2015 |
| CN | 104803568 A | 7/2015 |
| CN | 204436360 U | 7/2015 |
| CN | 204457524 U | 7/2015 |
| CN | 204472485 U | 7/2015 |
| CN | 204473625 U | 7/2015 |
| CN | 204477303 U | 7/2015 |
| CN | 204493095 U | 7/2015 |
| CN | 204493309 U | 7/2015 |
| CN | 103253839 B | 8/2015 |
| CN | 104820372 A | 8/2015 |
| CN | 104832093 A | 8/2015 |
| CN | 104863523 A | 8/2015 |
| CN | 204552723 U | 8/2015 |
| CN | 204553866 U | 8/2015 |
| CN | 204571831 U | 8/2015 |
| CN | 204703814 U | 10/2015 |
| CN | 204703833 U | 10/2015 |
| CN | 204703834 U | 10/2015 |
| CN | 105092401 A | 11/2015 |
| CN | 103233715 B | 12/2015 |
| CN | 103790927   | 12/2015 |
| CN | 105207097   | 12/2015 |
| CN | 204831952 U | 12/2015 |
| CN | 204899777 U | 12/2015 |
| CN | 102602323   | 1/2016 |
| CN | 105240064 A | 1/2016 |
| CN | 204944834   | 1/2016 |
| CN | 205042127 U | 2/2016 |
| CN | 205172478 U | 4/2016 |
| CN | 103993869 B | 5/2016 |
| CN | 105536299 A | 5/2016 |
| CN | 105545207 A | 5/2016 |
| CN | 205260249   | 5/2016 |
| CN | 103233714 B | 6/2016 |
| CN | 104340682 B | 6/2016 |
| CN | 205297518 U | 6/2016 |
| CN | 205298447 U | 6/2016 |
| CN | 205391821 U | 7/2016 |
| CN | 205400701 U | 7/2016 |
| CN | 103277290 B | 8/2016 |
| CN | 104260672 B | 8/2016 |
| CN | 205477370 U | 8/2016 |
| CN | 205479153 U | 8/2016 |

(56) References Cited

FOREIGN PATENT DOCUMENTS

| | | |
|---|---|---|
| CN | 205503058 U | 8/2016 |
| CN | 205503068 U | 8/2016 |
| CN | 205503089 U | 8/2016 |
| CN | 105958098 A | 9/2016 |
| CN | 205599180 | 9/2016 |
| CN | 205599180 U | 9/2016 |
| CN | 106121577 A | 11/2016 |
| CN | 205709587 | 11/2016 |
| CN | 104612928 B | 12/2016 |
| CN | 106246120 A | 12/2016 |
| CN | 205805471 | 12/2016 |
| CN | 106321045 A | 1/2017 |
| CN | 205858306 | 1/2017 |
| CN | 106438310 A | 2/2017 |
| CN | 205937833 | 2/2017 |
| CN | 104563994 B | 3/2017 |
| CN | 206129196 | 4/2017 |
| CN | 104369687 B | 5/2017 |
| CN | 106715165 | 5/2017 |
| CN | 106761561 A | 5/2017 |
| CN | 105240064 B | 6/2017 |
| CN | 206237147 | 6/2017 |
| CN | 206287832 | 6/2017 |
| CN | 206346711 | 7/2017 |
| CN | 104563995 B | 9/2017 |
| CN | 107120822 | 9/2017 |
| CN | 107143298 A | 9/2017 |
| CN | 107159046 A | 9/2017 |
| CN | 107188018 A | 9/2017 |
| CN | 206496016 | 9/2017 |
| CN | 104564033 B | 10/2017 |
| CN | 107234358 A | 10/2017 |
| CN | 107261975 A | 10/2017 |
| CN | 206581929 | 10/2017 |
| CN | 104820372 B | 12/2017 |
| CN | 105092401 B | 12/2017 |
| CN | 107476769 A | 12/2017 |
| CN | 107520526 A | 12/2017 |
| CN | 206754664 | 12/2017 |
| CN | 107605427 A | 1/2018 |
| CN | 106438310 B | 2/2018 |
| CN | 107654196 A | 2/2018 |
| CN | 107656499 A | 2/2018 |
| CN | 107728657 A | 2/2018 |
| CN | 206985503 | 2/2018 |
| CN | 207017968 | 2/2018 |
| CN | 107859053 A | 3/2018 |
| CN | 207057867 | 3/2018 |
| CN | 207085817 | 3/2018 |
| CN | 105545207 B | 4/2018 |
| CN | 107883091 A | 4/2018 |
| CN | 107902427 A | 4/2018 |
| CN | 107939290 A | 4/2018 |
| CN | 107956708 | 4/2018 |
| CN | 207169595 | 4/2018 |
| CN | 207194873 | 4/2018 |
| CN | 207245674 | 4/2018 |
| CN | 108034466 A | 5/2018 |
| CN | 108036071 A | 5/2018 |
| CN | 108087050 A | 5/2018 |
| CN | 207380566 | 5/2018 |
| CN | 108103483 A | 6/2018 |
| CN | 108179046 A | 6/2018 |
| CN | 108254276 A | 7/2018 |
| CN | 108311535 A | 7/2018 |
| CN | 207583576 | 7/2018 |
| CN | 207634064 | 7/2018 |
| CN | 207648054 | 7/2018 |
| CN | 207650621 | 7/2018 |
| CN | 108371894 A | 8/2018 |
| CN | 207777153 | 8/2018 |
| CN | 108547601 A | 9/2018 |
| CN | 108547766 A | 9/2018 |
| CN | 108555826 A | 9/2018 |
| CN | 108561098 A | 9/2018 |
| CN | 108561750 A | 9/2018 |
| CN | 108590617 A | 9/2018 |
| CN | 207813495 | 9/2018 |
| CN | 207814698 | 9/2018 |
| CN | 207862275 | 9/2018 |
| CN | 108687954 A | 10/2018 |
| CN | 207935270 | 10/2018 |
| CN | 207961582 | 10/2018 |
| CN | 207964530 | 10/2018 |
| CN | 108789848 A | 11/2018 |
| CN | 108868675 A | 11/2018 |
| CN | 208086829 | 11/2018 |
| CN | 208089263 | 11/2018 |
| CN | 108979569 A | 12/2018 |
| CN | 109027662 A | 12/2018 |
| CN | 109058092 A | 12/2018 |
| CN | 208179454 | 12/2018 |
| CN | 208179502 | 12/2018 |
| CN | 208260574 | 12/2018 |
| CN | 109114418 A | 1/2019 |
| CN | 109141990 A | 1/2019 |
| CN | 208313120 | 1/2019 |
| CN | 208330319 | 1/2019 |
| CN | 208342730 | 1/2019 |
| CN | 208430982 | 1/2019 |
| CN | 208430986 | 1/2019 |
| CN | 109404274 A | 3/2019 |
| CN | 109429610 A | 3/2019 |
| CN | 109491318 A | 3/2019 |
| CN | 109515177 A | 3/2019 |
| CN | 109526523 A | 3/2019 |
| CN | 109534737 A | 3/2019 |
| CN | 208564504 | 3/2019 |
| CN | 208564516 | 3/2019 |
| CN | 208564525 | 3/2019 |
| CN | 208564918 | 3/2019 |
| CN | 208576026 | 3/2019 |
| CN | 208576042 | 3/2019 |
| CN | 208650818 | 3/2019 |
| CN | 208669244 | 3/2019 |
| CN | 109555484 A | 4/2019 |
| CN | 109682881 A | 4/2019 |
| CN | 208730959 | 4/2019 |
| CN | 208735264 | 4/2019 |
| CN | 208746733 | 4/2019 |
| CN | 208749529 | 4/2019 |
| CN | 208750405 | 4/2019 |
| CN | 208764658 | 4/2019 |
| CN | 109736740 A | 5/2019 |
| CN | 109751007 A | 5/2019 |
| CN | 208868428 | 5/2019 |
| CN | 208870761 | 5/2019 |
| CN | 109869294 A | 6/2019 |
| CN | 109882144 A | 6/2019 |
| CN | 109882372 A | 6/2019 |
| CN | 209012047 | 6/2019 |
| CN | 209100025 | 7/2019 |
| CN | 110080707 A | 8/2019 |
| CN | 110118127 A | 8/2019 |
| CN | 110124574 A | 8/2019 |
| CN | 110145277 A | 8/2019 |
| CN | 110145399 A | 8/2019 |
| CN | 110152552 A | 8/2019 |
| CN | 110155193 A | 8/2019 |
| CN | 110159225 A | 8/2019 |
| CN | 110159432 | 8/2019 |
| CN | 110159432 A | 8/2019 |
| CN | 110159433 A | 8/2019 |
| CN | 110208100 A | 9/2019 |
| CN | 110252191 A | 9/2019 |
| CN | 110284854 A | 9/2019 |
| CN | 110284972 A | 9/2019 |
| CN | 209387358 | 9/2019 |
| CN | 110374745 A | 10/2019 |
| CN | 209534736 | 10/2019 |
| CN | 110425105 A | 11/2019 |
| CN | 110439779 A | 11/2019 |
| CN | 110454285 A | 11/2019 |
| CN | 110454352 A | 11/2019 |

(56) References Cited

FOREIGN PATENT DOCUMENTS

| | | |
|---|---|---|
| CN | 110467298 A | 11/2019 |
| CN | 110469312 A | 11/2019 |
| CN | 110469314 A | 11/2019 |
| CN | 110469405 A | 11/2019 |
| CN | 110469654 A | 11/2019 |
| CN | 110485982 A | 11/2019 |
| CN | 110485983 A | 11/2019 |
| CN | 110485984 A | 11/2019 |
| CN | 110486249 A | 11/2019 |
| CN | 110500255 A | 11/2019 |
| CN | 110510771 A | 11/2019 |
| CN | 110513097 A | 11/2019 |
| CN | 209650738 | 11/2019 |
| CN | 209653968 | 11/2019 |
| CN | 209654004 | 11/2019 |
| CN | 209654022 | 11/2019 |
| CN | 209654128 | 11/2019 |
| CN | 209656622 | 11/2019 |
| CN | 107849130 B | 12/2019 |
| CN | 108087050 B | 12/2019 |
| CN | 110566173 A | 12/2019 |
| CN | 110608030 A | 12/2019 |
| CN | 110617187 A | 12/2019 |
| CN | 110617188 A | 12/2019 |
| CN | 110617318 A | 12/2019 |
| CN | 209740823 | 12/2019 |
| CN | 209780827 | 12/2019 |
| CN | 209798631 | 12/2019 |
| CN | 209799942 | 12/2019 |
| CN | 209800178 | 12/2019 |
| CN | 209855723 | 12/2019 |
| CN | 209855742 | 12/2019 |
| CN | 209875063 | 12/2019 |
| CN | 110656919 A | 1/2020 |
| CN | 107520526 B | 2/2020 |
| CN | 110787667 A | 2/2020 |
| CN | 110821464 A | 2/2020 |
| CN | 110833665 A | 2/2020 |
| CN | 110848028 A | 2/2020 |
| CN | 210049880 | 2/2020 |
| CN | 210049882 | 2/2020 |
| CN | 210097596 | 2/2020 |
| CN | 210105817 | 2/2020 |
| CN | 210105818 | 2/2020 |
| CN | 210105993 | 2/2020 |
| CN | 110873093 A | 3/2020 |
| CN | 210139911 | 3/2020 |
| CN | 110947681 A | 4/2020 |
| CN | 111058810 A | 4/2020 |
| CN | 111075391 A | 4/2020 |
| CN | 210289931 | 4/2020 |
| CN | 210289932 | 4/2020 |
| CN | 210289933 | 4/2020 |
| CN | 210303516 | 4/2020 |
| CN | 211412945 | 4/2020 |
| CN | 111089003 A | 5/2020 |
| CN | 111151186 A | 5/2020 |
| CN | 111167769 A | 5/2020 |
| CN | 111169833 A | 5/2020 |
| CN | 111173476 A | 5/2020 |
| CN | 111185460 A | 5/2020 |
| CN | 111185461 A | 5/2020 |
| CN | 111188763 A | 5/2020 |
| CN | 111206901 A | 5/2020 |
| CN | 111206992 A | 5/2020 |
| CN | 111206994 A | 5/2020 |
| CN | 210449044 | 5/2020 |
| CN | 210460875 | 5/2020 |
| CN | 210522432 | 5/2020 |
| CN | 210598943 | 5/2020 |
| CN | 210598945 | 5/2020 |
| CN | 210598946 | 5/2020 |
| CN | 210599194 | 5/2020 |
| CN | 210599303 | 5/2020 |
| CN | 210600110 | 5/2020 |
| CN | 111219326 A | 6/2020 |
| CN | 111350595 A | 6/2020 |
| CN | 210660319 | 6/2020 |
| CN | 210714569 | 6/2020 |
| CN | 210769168 | 6/2020 |
| CN | 210769169 | 6/2020 |
| CN | 210769170 | 6/2020 |
| CN | 210770133 | 6/2020 |
| CN | 210825844 | 6/2020 |
| CN | 210888904 | 6/2020 |
| CN | 210888905 | 6/2020 |
| CN | 210889242 | 6/2020 |
| CN | 111397474 A | 7/2020 |
| CN | 111412064 A | 7/2020 |
| CN | 111441923 A | 7/2020 |
| CN | 111441925 A | 7/2020 |
| CN | 111503517 A | 8/2020 |
| CN | 111515898 A | 8/2020 |
| CN | 111594059 A | 8/2020 |
| CN | 111594062 A | 8/2020 |
| CN | 111594144 A | 8/2020 |
| CN | 211201919 | 8/2020 |
| CN | 211201920 | 8/2020 |
| CN | 211202218 | 8/2020 |
| CN | 111608965 A | 9/2020 |
| CN | 111664087 A | 9/2020 |
| CN | 111677476 A | 9/2020 |
| CN | 111677647 A | 9/2020 |
| CN | 111692064 A | 9/2020 |
| CN | 111692065 A | 9/2020 |
| CN | 211384571 | 9/2020 |
| CN | 211397553 | 9/2020 |
| CN | 211397677 | 9/2020 |
| CN | 211500955 | 9/2020 |
| CN | 211524765 | 9/2020 |
| DE | 4241614 | 6/1994 |
| DE | 102012018825 | 3/2014 |
| EP | 0835983 | 4/1998 |
| EP | 1378683 | 1/2004 |
| EP | 2143916 | 1/2010 |
| EP | 2613023 | 7/2013 |
| EP | 3095989 | 11/2016 |
| EP | 3211766 | 8/2017 |
| EP | 3354866 | 8/2018 |
| EP | 3075946 | 5/2019 |
| GB | 1438172 | 6/1976 |
| JP | S57135212 | 2/1984 |
| KR | 20020026398 | 4/2002 |
| RU | 13562 | 4/2000 |
| WO | 1993020328 | 10/1993 |
| WO | 2006025886 | 3/2006 |
| WO | 2009023042 | 2/2009 |
| WO | 20110133821 | 10/2011 |
| WO | 2012139380 | 10/2012 |
| WO | 2013185399 | 12/2013 |
| WO | 2015158020 | 10/2015 |
| WO | 2016033983 | 3/2016 |
| WO | 2016078181 | 5/2016 |
| WO | 2016101374 | 6/2016 |
| WO | 2016112590 | 7/2016 |
| WO | 2017123656 A | 7/2017 |
| WO | 2017213848 | 12/2017 |
| WO | 2018031029 | 2/2018 |
| WO | 2018038710 | 3/2018 |
| WO | 2018044293 | 3/2018 |
| WO | 2018044307 | 3/2018 |
| WO | 2018071738 | 4/2018 |
| WO | 2018101909 | 6/2018 |
| WO | 2018101912 | 6/2018 |
| WO | 2018106210 | 6/2018 |
| WO | 2018106225 | 6/2018 |
| WO | 2018106252 | 6/2018 |
| WO | 2018156131 | 8/2018 |
| WO | 2018075034 | 10/2018 |
| WO | 2018187346 | 10/2018 |
| WO | 2018031031 | 2/2019 |
| WO | 2019045691 | 3/2019 |
| WO | 2019060922 | 3/2019 |
| WO | 2019126742 | 6/2019 |

(56) References Cited

FOREIGN PATENT DOCUMENTS

| | | |
|---|---|---|
| WO | 2019147601 | 8/2019 |
| WO | 2019169366 | 9/2019 |
| WO | 2019195651 | 10/2019 |
| WO | 2019200510 | 10/2019 |
| WO | 2019210417 | 11/2019 |
| WO | 2020018068 | 1/2020 |
| WO | 2020046866 | 3/2020 |
| WO | 2020072076 | 4/2020 |
| WO | 2020076569 | 4/2020 |
| WO | 2020097060 | 5/2020 |
| WO | 2020104088 | 5/2020 |
| WO | 2020131085 | 6/2020 |
| WO | 2020211083 | 10/2020 |
| WO | 2020211086 | 10/2020 |
| WO | 2021041783 | 3/2021 |

OTHER PUBLICATIONS

Filipović, Ivan, Preliminary Selection of Basic Parameters of Different Torsional Vibration Dampers Intended for use in Medium-Speed Diesel Engines, Transactions of Famena XXXVI-3 (2012).
Marine Turbine Technologies, 1 MW Power Generation Package, http://marineturbine.com/power-generation, 2017.
Business Week: Fiber-optic cables help fracking, cablinginstall.com. Jul. 12, 2013. https://www.cablinginstall.com/cable/article/16474208/businessweek-fiberoptic-cables-help-fracking.
Fracking companies switch to electric motors to power pumps, iadd-intl.org. Jun. 27, 2019. https://www.iadd-intl.org/articles/fracking-companies-switch-to-electric-motors-to-power-pumps/.
The Leader in Frac Fueling, suncoastresources.com. Jun. 29, 2015. https://web.archive.org/web/20150629220609/https://www.suncoastresources.com/oilfield/fueling-services/.
Mobile Fuel Delivery, atlasoil.com. Mar. 6, 2019. https://www.atlasoil.com/nationwide-fueling/onsite-and-mobile-fueling.
Frac Tank Hose (FRAC), 4starhose.com. Accessed: Nov. 10, 2019. http://www.4starhose.com/product/frac_tank_hose_frac.aspx.
PLOS One, Dynamic Behavior of Reciprocating Plunger Pump Discharge Valve Based on Fluid Structure Interaction and Experimental Analysis. Oct. 21, 2015.
FMC Technologies, Operation and Maintenance Manual, L06 Through L16 Triplex Pumps Doc No. OMM50000903 Rev: E p. 1 of 66. Aug. 27, 2009.
Gardner Denver Hydraulic Fracturing Pumps GD 3000 https://www.gardnerdenver.com/en-us/pumps/triplex-fracking-pump-gd-3000.
Lekontsev, Yu M., et al. "Two-side sealer operation." Journal of Mining Science 49.5 (2013): 757-762.
Tom Hausfeld, GE Power & Water, and Eldon Schelske, Evolution Well Services, TM2500+ Power for Hydraulic Fracturing.
FTS International's Dual Fuel Hydraulic Fracturing Equipment Increases Operational Efficiencies, Provides Cost Benefits, Jan. 3, 2018.
CNG Delivery, Fracturing with natural gas, dual-fuel drilling with CNG, Aug. 22, 2019.
PbNG, Natural Gas Fuel for Drilling and Hydraulic Fracturing, Diesel Displacement / Dual Fuel & Bi-Fuel, May 2014.
Integrated Flow, Skid-mounted Modular Process Systems, Jul. 15, 2017, https://ifsolutions.com/why-modular/.
Cameron, A Schlumberger Company, Frac Manifold Systems, 2016.
ZSi-Foster, Energy | Solar | Fracking | Oil and Gas, Aug. 2020, https://www.zsi-foster.com/energy-solar-fracking-oil-and-gas.html.
JBG Enterprises, Inc., WS-Series Blowout Prevention Safety Coupling—Quick Release Couplings, Sep. 11, 2015, http://www.jgbhose.com/products/WS-Series-Blowout-Prevention-Safety-Coupling.asp.
Halliburton, Vessel-based Modular Solution (VMS), 2015.
Chun, M. K., H. K. Song, and R. Lallemand. "Heavy duty gas turbines in petrochemical plants: Samsung's Daesan plant (Korea) beats fuel flexibility records with over 95% hydrogen in process gas." Proceedings of PowerGen Asia Conference, Singapore. 1999.

Wolf, Jürgen J., and Marko A. Perkavec. "Safety Aspects and Environmental Considerations for a 10 MW Cogeneration Heavy Duty Gas Turbine Burning Coke Oven Gas with 60% Hydrogen Content." ASME 1992 International Gas Turbine and Aeroengine Congress and Exposition. American Society of Mechanical Engineers Digital Collection, 1992.
Ginter, Timothy, and Thomas Bouvay. "Uprate options for the MS7001 heavy duty gas turbine." GE paper GER-3808C, GE Energy 12 (2006).
Chaichan, Miqdam Tariq. "The impact of equivalence ratio on performance and emissions of a hydrogen-diesel dual fuel engine with cooled exhaust gas recirculation." International Journal of Scientific & Engineering Research 6.6 (2015): 938-941.
Ecob, David J., et al. "Design and Development of a Landfill Gas Combustion System for the Typhoon Gas Turbine." ASME 1996 International Gas Turbine and Aeroengine Congress and Exhibition. American Society of Mechanical Engineers Digital Collection, 1996.
II-VI Marlow Industries, Thermoelectric Technologies in Oil, Gas, and Mining Industries, blog.marlow.com (Jul. 24, 2019).
B.M. Mahlalela, et al., .Electric Power Generation Potential Based on Waste Heat and Geothermal Resources in South Africa, pangea.stanford.edu (Feb. 11, 2019).
Department of Energy, United States of America, The Water-Energy Nexus: Challenges and Opportunities purenergypolicy.org (Jun. 2014).
Ankit Tiwari, Design of a Cooling System for a Hydraulic Fracturing Equipment, The Pennsylvania State University, The Graduate School, College of Engineering, 2015.
Jp Yadav et al., Power Enhancement of Gas Turbine Plant by Intake Air Fog Cooling, Jun. 2015.
Mee Industries: Inlet Air Fogging Systems for Oil, Gas and Petrochemical Processing, Verdict Media Limited Copyright 2020.
M. Ahmadzadehtalatapeh et al.Performance enhancement of gas turbine units by retrofitting with inlet air cooling technologies (IACTs): an hour-by-hour simulation study, Journal of the Brazilian Society of Mechanical Sciences and Engineering, Mar. 2020.
Advances in Popular Torque-Link Solution Offer OEMs Greater Benefit, Jun. 21, 2018.
Emmanuel Akita et al., Mewbourne College of Earth & Energy, Society of Petroleum Engineers; Drilling Systems Automation Technical Section (DSATS); 2019.
PowerShelter Kit II, nooutage.com, Sep. 6, 2019.
EMPengineering.com, HEMP Resistant Electrical Generators / Hardened Structures HEMP/GMD Shielded Generators, Virginia, Nov. 3, 2012.
Blago Minovski, Coupled Simulations of Cooling and Engine Systems for Unsteady Analysis of the Benefits of Thermal Engine Encapsulation, Department of Applied Mechanics, Chalmers University of Technology Göteborg, Sweden 2015.
J. Porteiro et al., Feasibility of a new domestic CHP trigeneration with heat pump: II. Availability analysis. Design and development, Applied Thermal Engineering 24 (2004) 1421-1429.
Europump and Hydraulic Institute, Variable Speed Pumping: A Guide to Successful Applications, Elsevier Ltd, 2004.
Capstone Turbine Corporation, Capstone Receives Three Megawatt Order from Large Independent Oil & Gas Company in Eagle Ford Shale Play, Dec. 7, 2010.
Wikipedia, Westinghouse Combustion Turbine Systems Division, https://en.wikipedia.org/wiki/Westinghouse_Combustion_Turbine_Systems_Division, circa 1960.
Wikipedia,Union Pacific GTELs, https://en.wikipedia.org/wiki/Union_Pacific_GTELs, circa 1950.
HCI JET Frac, Screenshots from YouTube, Dec. 11, 2010. https://www.youtube.com/watch?v=6HjXkdbFaFQ.
AFD Petroleum Ltd., Automated Hot Zone, Frac Refueling System, Dec. 2018.
Eygun, Christiane, et al., URTeC: 2687987, Mitigating Shale Gas Developments Carbon Footprint: Evaluating and Implementing Solutions in Argentina, Copyright 2017, Unconventional Resources Technology Conference.
Walzel, Brian, Hart Energy, Oil, Gas Industry Discovers Innovative Solutions to Environmental Concerns, Dec. 10, 2018.

(56) References Cited

OTHER PUBLICATIONS

Frac Shack, Bi-Fuel FracFueller brochure, 2011.
Pettigrew, Dana, et al., High Pressure Multi-Stage Centrifugal Pump for 10,000 psi Frac Pump—HPHPS FRAC Pump, Copyright 2013, Society of Petroleum Engineers, SPE 166191.
Elle Seybold, et al., Evolution of Dual Fuel Pressure Pumping for Fracturing: Methods, Economics, Field Trial Results and Improvements in Availability of Fuel, Copyright 2013, Society of Petroleum Engineers, SPE 166443.
Wallace, E.M., Associated Shale Gas: From Flares to Rig Power, Copyright 2015, Society of Petroleum Engineers, SPE-173491-MS.
Williams, C.W. (Gulf Oil Corp. Odessa Texas), The Use of Gas-turbine Engines in an Automated High-Pressure Water-injection Stations; American Petroleum Institute; API-63-144 (Jan. 1, 1963).
Neal, J.C. (Gulf Oil Corp. Odessa Texas), Gas Turbine Driven Centrifugal Pumps for High Pressure Water Injection; American Institute of Mining, Metallurgical and Petroleum Engineers, Inc.; SPE-1888 (1967).
Porter, John A. (Solar Division International Harvester Co.), Modern Industrial Gas Turbines for the Oil Field; American Petroleum Institute; Drilling and Production Practice; API-67-243 (Jan. 1, 1967).
Cooper et al., Jet Frac Porta-Skid—A New Concept in Oil Field Service Pump Equipments[sic]; Halliburton Services; SPE-2706 (1969).
Ibragimov, É.S., Use of gas-turbine engines in oil field pumping units; Chem Petrol Eng; (1994) 30: 530. https://doi.org/10.1007/BF01154919. (Translated from Khimicheskaya i Neftyanoe Mashinostroenie, No. 11, pp. 24-26, Nov. 1994.).
Kas'yanov et al., Application of gas-turbine engines in pumping units complexes of hydraulic fracturing of oil and gas reservoirs; Exposition Oil & Gas; (Oct. 2012) (published in Russian).
AFGlobal Corporation, Durastim Hydraulic Fracturing Pump, A Revolutionary Design for Continuous Duty Hydraulic Fracturing, 2018.
SPM® QEM 5000 E-Frac Pump Specification Sheet, Weir Group (2019) ("Weir 5000").
Green Field Energy Services Natural Gas Driven Turbine Frac Pumps HHP Summit Presentation, Yumpu (Sep. 2012), https://www.yumpu.com/en/document/read/49685291/turbine-frac-pump-assembly-hhp ("Green Field").
Dowell B908 "Turbo-Jet" Operator's Manual.
Jereh Debut's Super-power Turbine Fracturing Pump, Leading the Industrial Revolution, Jereh Oilfield Services Group (Mar. 19, 2014), https://www.prnewswire.com/news-releases/jereh-debuts-super-power-turbine-fracturing-pump-leading-the-industrial-revolution-250992111.html.
Jereh Apollo 4500 Turbine Frac Pumper Finishes Successful Field Operation in China, Jereh Group (Feb. 13, 2015), as available on Apr. 20, 2015, https://web.archive.org/web/20150420220625/https://www.prnewswire.com/news-releases/jereh-apollo-4500-turbine-frac-pumper-finishes-successful-field-operation-in-china-300035829.html.
35% Economy Increase, Dual-fuel System Highlighting Jereh Apollo Frac Pumper, Jereh Group (Apr. 13, 2015), https://www.jereh.com/en/news/press-release/news-detail-7345.htm.
Hydraulic Fracturing: Gas turbine proves successful in shale gas field operations, Vericor (2017), https://www.vericor.com/wp-content/uploads/2020/02/7.-Fracing-4500hp-Pump-China-En.pdf ("Vericor Case Study").
Jereh Apollo Turbine Fracturing Pumper Featured on China Central Television, Jereh Group (Mar. 9, 2018), https://www.jereh.com/en/news/press-release/news-detail-7267.htm.
Jereh Unveiled New Electric Fracturing Solution at OTC 2019, Jereh Group (May 7, 2019), as available on May 28, 2019, https://web.archive.org/web/20190528183906/https://www.prnewswire.com/news-releases/jereh-unveiled-new-electric-fracturing-solution-at-otc-2019-300845028.html.
Jereh Group, Jereh Fracturing Unit, Fracturing Spread, YouTube (Mar. 30, 2015), https://www.youtube.com/watch?v=PlkDbU5dE0o.
Transcript of Jereh Group, Jereh Fracturing Unit, Fracturing Spread, YouTube (Mar. 30, 2015).
Jereh Group, Jereh Fracturing Equipment. YouTube (Jun. 8, 2015), https://www.youtube.com/watch?v=m0vMiq84P4Q.
Transcript of Jereh Group, Jereh Fracturing Equipment, YouTube (Jun. 8, 2015), https://www.youtube.com/watch?v=m0vMiq84P4Q.
Ferdinand P. Beer et al., Mechanics of Materials (6th ed. 2012).
Weir Oil & Gas Introduces Industry's First Continuous Duty 5000-Horsepower Pump, Weir Group (Jul. 25, 2019), https://www.global.weir/newsroom/news-articles/weir-oil-and-gas-introduces-industrys-first-continuous-duty-5000-horsepower-pump/.
2012 High Horsepower Summit Agenda, Natural Gas for High Horsepower Applications (Sep. 5, 2012).
Review of HHP Summit 2012, Gladstein, Neandross & Associates https://www.gladstein.org/gna-conferences/high-horsepower-summit-2012/.
Green Field Energy Services Deploys Third New Hydraulic Fracturing System, Green Field Energy Services, Inc. (Jul. 11, 2012), https://www.prnewswire.com/news-releases/green-field-energy-services-deploys-third-new-hydidulic-fracturing-spread-162113425.
Karen Boman, Turbine Technology Powers Green Field Multi-Fuel Frack Pump, Rigzone (Mar. 7, 2015), as available on Mar. 14, 2015, https://web.archive.org/web/20150314203227/https://www.rigzone.co m/news/oil-gas/a/124883/Turbine_Technology_Powers_Green_Field_MultiFuel_Frack_Pump.
"Turbine Frac Units," WMD Squared (2012), https://wmdsquared.com/work/gfes-turbine-frac-units/.
Leslie Turj, Green Field asset sale called 'largest disposition industry has seen,' The INDsider Media (Mar. 19, 2014), http://theind.com/article-16497-green-field-asset-sale-called-%E2%80%98largest-disposition-industry-has-seen%60.html.
American Petroleum Institute. API 674: Positive Displacement Pumps—Reciprocating. 3rd ed. Washington, DC: API Publishing Services, 2010.
American Petroleum Institute. API 616: Gas Turbines for the Petroleum, Chemical, and Gas Industry Services. 5th ed. Washington, DC: API Publishing Services, 2011.
Karassik, Igor, Joseph Messina, Paul Cooper, and Charles Heald. Pump Handbook. 4th ed. New York: McGraw-Hill Education, 2008.
Weir SPM. Weir SPM General Catalog: Well Service Pumps, Flow Control Products, Manifold Trailers, Safety Products, Post Sale Services. Ft. Worth, TX: Weir Oil & Gas. May 28, 2016. https://www.pumpfundamentals.com/pumpdatabase2/weir-spm-general.pdf.
The Weir Group, Inc. Weir SPM Pump Product Catalog. Ft. Worth, TX: S.P.M. Flow Control, Inc. Oct. 30, 2017. https://manage.global.weir/assets/files/product%20brochures/SPM_2P140706_Pump_Product_Catalogue_View.pdf.
Shandong Saigao Group Corporation. Q4 (5W115) Quintuplex Plunger Pump. Jinan City, Shandong Province, China: Saigao. Oct. 20, 2014. https://www.saigaogroup.com/product/q400-5w115-quintuplex-plunger-pump.html.
Marine Turbine. Turbine Powered Frac Units. Franklin, Louisiana: Marine Turbine Technologies, 2020.
Rotating Right. Quintuplex Power Pump Model Q700. Edmonton, Alberta, Canada: Weatherford International Ltd. https://www.rotatingright.com/pdf/weatherford/RR%2026-Weatherford%20Model%20Q700.pdf, 2021.
CanDyne Pump Services, Inc. Weatherford Q700 Pump. Calgary, Alberta, Canada: CanDyne Pump Services. Aug. 15, 2015. http://candyne.com/wp-content/uploads/2014/10/181905-94921.q700-quintuplex-pump.pdf.
Arop, Julius Bankong. Geomechanical review of hydraulic fracturing technology. Thesis (M. Eng.). Cambridge, MA: Massachusetts Institute of Technology, Dept. of Civil and Environmental Engineering. Oct. 29, 2013. https://dspace.mit.edu/handle/1721.1/82176.

\* cited by examiner

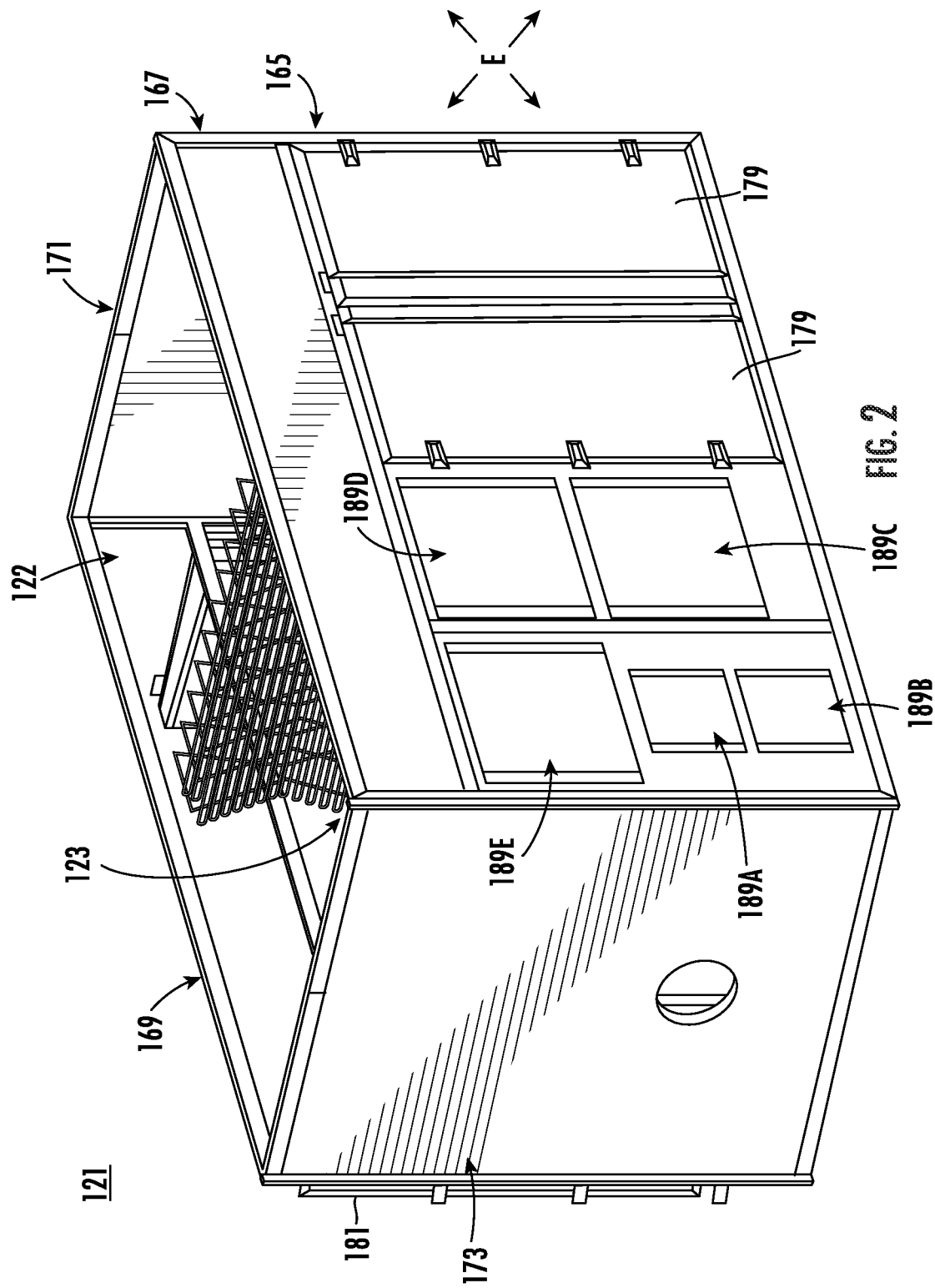

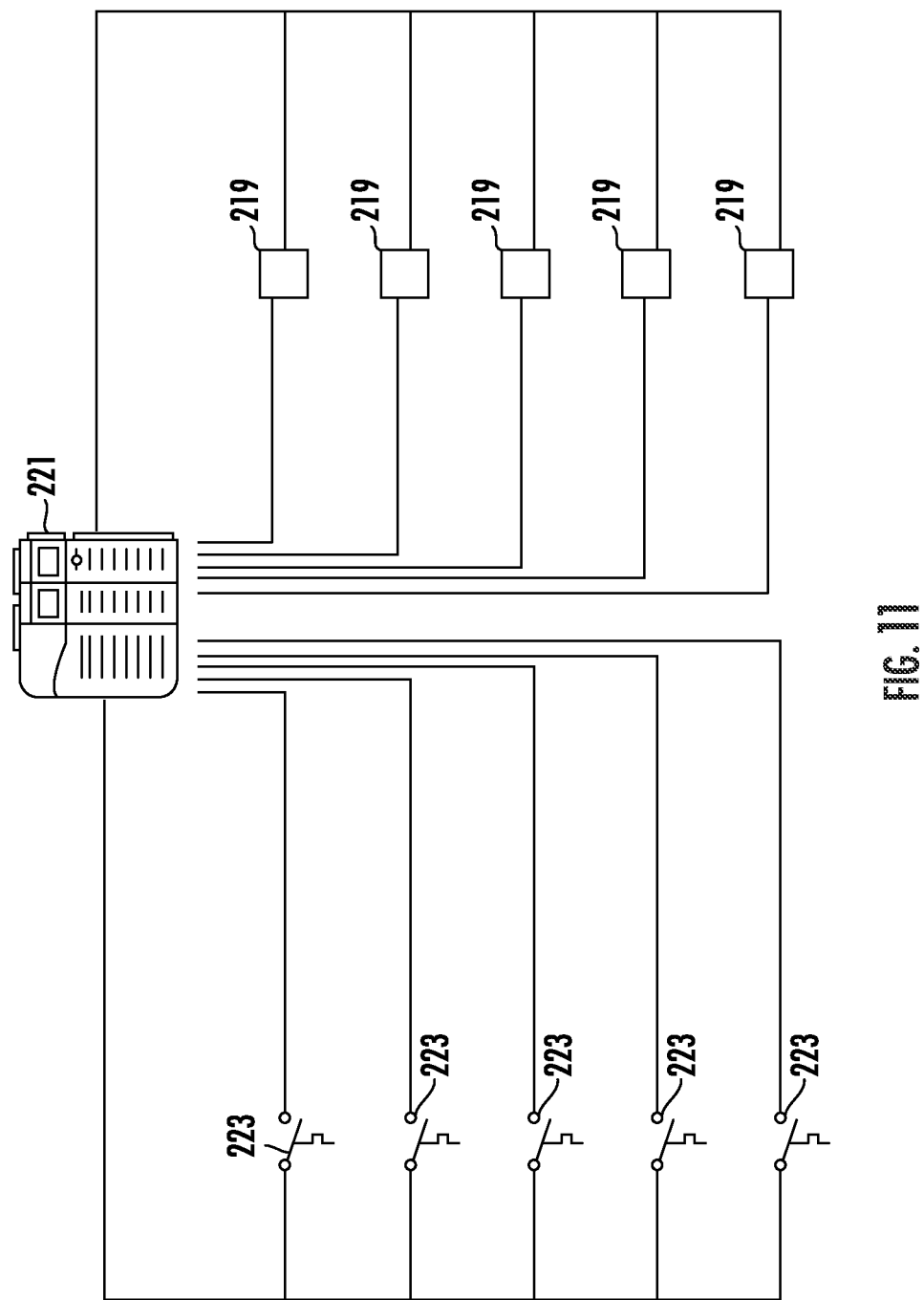

ENCLOSURE ASSEMBLY FOR ENHANCED COOLING OF DIRECT DRIVE UNIT AND RELATED METHODS

PRIORITY CLAIM

This is a divisional of U.S. Non-Provisional application Ser. No. 17/302,039, filed Apr. 22, 2021, titled "ENCLOSURE ASSEMBLY FOR ENHANCED COOLING OF DIRECT DRIVE UNIT AND RELATED METHODS," which claims priority to and the benefit of, under 35 U.S.C. § 119(e), U.S. Provisional Application No. 62/705,042, filed Jun. 9, 2020, titled "ENCLOSURE ASSEMBLY FOR ENHANCED COOLING OF DIRECT DRIVE UNIT AND RELATED METHODS," and U.S. Provisional Application No. 62/704,981, filed Jun. 5, 2020, titled "ENCLOSURE ASSEMBLY FOR ENHANCED COOLING OF DIRECT DRIVE UNIT (DDU) AND RELATED METHODS," the disclosures of which are incorporated herein by reference in their entireties.

TECHNICAL FIELD

This disclosure relates to enclosure assemblies and related systems and methods for providing enhanced cooling of a direct drive unit (DDU), such as a direct drive turbine (DDT) connected to a gearbox for driving a driveshaft connected to a pump for use in a hydraulic fracturing systems and methods.

BACKGROUND

During fracturing operations, the equipment onboard fracturing trailers utilizes extensive cooling to facilitate operation throughout the pumping stage. The fracturing pump may have, for example, up to 5% energy loss of energy through heat rejection during operation. Such heat rejection may enter bearings, connecting rods, the casing, clamps and other highly temperature sensitive components in the pumps power end. These components are typically kept lubricated and cooled using lube oil that is pumped continuously through circuits into the pump ensuring that the lube oil is cascaded around the crank case of the fluid pump.

Heat rejection from the pump is still absorbed into the oil, however, and this oil is cooled through a lubrication circuit to ensure that the oil remains at a manageable temperature set out by regulation and/or pump original equipment manufacturers (OEMs). The cooling of oil may be achieved by diverting the oil to a heat exchanger (for example, a fan driven heat exchanger, tube and shell heat exchanger, or other heat exchanger as will be understood by those skilled in the art.) that is be sized and configured to be able to remove enough heat from the fluid that will allow the oil to enter the crank case again and absorb more heat rejection.

This cooling cycle may occur constantly onboard fracturing trailers with the operations of the heat exchangers at times being hydraulically or electrically driven. The need for higher power rated fracturing pumps, for example, 5000 HP or 7000 HP rated fracturing pumps, may require larger cooling packages to be able to manage the heat rejection. Accordingly, more heat rejection may directly correlate to the physical footprint of the cooling systems.

SUMMARY OF THE DISCLOSURE

In view of the foregoing, there is an ongoing need for an enclosure assembly and related systems and methods that are more suitable for cooling the DDU of a pumping system, as well as for high-pressure and high-power operations.

Accordingly, it may be seen that a need exists for managing the location of cooling systems to minimize physical footprint, for managing associated power resources efficiently, and for providing effective cooling for fracturing pumps and DDUs. The present disclosure addresses these and other related and unrelated problems in the art.

One exemplary embodiment of the disclosure includes an enclosure assembly to enhance cooling of a hydraulic fracturing direct drive unit (DDU) during operation. An enclosure body may be provided extending at least partially around an enclosure space to house the DDU, which may include a turbine engine that is mechanically connected to a gearbox for driving a driveshaft connected to the gearbox in order to drive a fluid pump. The enclosure assembly may include one or more heat exchanger assemblies connected to the enclosure body for cooling a process fluid associated with one or more of the DDU and the fluid pump, for example, a lubrication or other lubrication medium, and/or a hydraulic/working fluid that is heated during operation. The one or more heat exchanger assemblies may include one or more intake fan assemblies positioned in fluid communication with an external environment surrounding the enclosure body, and one or more intake fan motors may be operatively connected to the one or more intake fan assemblies. Thus, when the one or more intake fan motors is activated, the one or more intake fan assemblies may draw air into the enclosure space from the external environment at the one or more intake fan assemblies and along an airflow path through the enclosure space. One or more radiator assemblies may further be included in the one or more heat exchanger assemblies for receiving the process fluid, and positioned adjacent the one or more intake fan assemblies in the airflow path through the enclosure space to cool the process fluid with air from the external environment as it flows toward the radiator assembly.

In addition, the enclosure assembly may include one or more outlet fan assemblies positioned in fluid communication with the external environment. Accordingly, to maintain a desired temperature of the enclosure space, the one or more outlet fan assemblies may be operatively connected to one or more outlet fan motors to discharge air from the enclosure space to the external environment when the one or more outlet fan motors is activated such that airflow heated by the cooling of the process fluid may be ventilated from the enclosure assembly. The enclosure assembly may also include one or more temperature sensors to detect a temperature of the enclosure space and, further, one or more controllers in electrical communication with the one or more temperature sensors. The one or more controllers may be operatively connected to one or more of the one or more intake fan motors and the one or more outlet fan motors. In this regard, the one or more controllers may activate the respective one or more intake fan motors and the one or more outlet fan motors to rotate the respective one or more intake fan assemblies and the one or more outlet fan assemblies responsive to a predetermined temperature signal from the one or more temperature sensors to discharge heated air from and maintain a desired temperature of the enclosure space.

Another exemplary embodiment of the disclosure includes a fluid pumping system for high-pressure, high-power hydraulic fracturing operations. The system may include a direct drive unit (DDU) having a turbine engine mechanically connected to a gearbox for driving a driveshaft, and a fluid pump operatively connected to the DDU by the driveshaft for driving the fluid pump. Accordingly, one or more of the DDU and the fluid pump may generate and heat process fluid during operation, which may include lubrication oil or another lubrication medium, and/or a hydraulic or other working fluid. The system may include an enclosure assembly having an enclosure body extending around an enclosure space to house the DDU, and one or more or more heat exchanger assemblies connected to the enclosure body for cooling process fluid associated with one or more of the DDU and the fluid pump. The one or more heat exchanger assemblies of the system may include one or more intake fan assemblies positioned in fluid communication with an external environment surrounding the enclosure body, and one or more intake fan motors may be operatively connected to the one or more intake fan assemblies. When the one or more intake fan motors is activated, the one or more intake fan assemblies may draw air into the enclosure space from the external environment at the one or more intake fan assemblies and along an airflow path through the enclosure space. One or more radiator assemblies may be included in the one or more heat exchanger assemblies for receiving the process fluid, and may be positioned adjacent the one or more intake fan assemblies in the airflow path through the enclosure space to cool the process fluid with the air drawn in from the external environment as it flows through the radiator assembly.

The system's enclosure assembly may also include one or more outlet fan assemblies positioned in fluid communication with the external environment. In order to maintain a desired temperature of the enclosure space, the one or more outlet fan assemblies may be operatively connected to one or more outlet fan motors to discharge air from the enclosure space to the external environment when the one or more outlet fan motors is activated so that airflow in the enclosure space that has been heated from the cooling of the process fluid may be ventilated from the enclosure assembly. The enclosure assembly of the system may also include one or more temperature sensors to detect a temperature of the enclosure space and, further, one or more controllers in electrical communication with the one or more temperature sensors. The one or more controllers may be operatively connected to one or more of the one or more intake fan motors and the one or more outlet fan motors. In this regard, the one or more controllers may activate the respective one or more intake fan motors and the one or more outlet fan motors to rotate the respective one or more intake fan assemblies and the one or more outlet fan assemblies responsive to a predetermined temperature signal from the one or more temperature sensors to discharge heated air from and maintain a desired temperature of the enclosure space Still another exemplary embodiment of the disclosure includes a method of enhancing cooling during operation of a hydraulic fracturing direct drive unit (DDU) having a turbine engine mechanically connected to a gearbox. The method may include operating the DDU to drive a driveshaft operatively connected to a fluid pump such that one or more of the turbine engines and the fluid pump generate and heat process fluid, for example, a lubrication or other lubrication medium, and/or a hydraulic/working fluid. The method may include detecting a temperature in an enclosure space of an enclosure assembly housing the DDU with one or more temperature sensors, and, further, controlling one or more intake fan assemblies of one or more heat exchanger assemblies in the enclosure space to draw air from an external environment into an airflow through the enclosure space based upon a temperature signal detected by the one or more temperature sensors. In this regard, the method may include cooling the process fluid by directing airflow from the one or more intake fan assemblies toward one or more radiator assemblies of the one or more heat exchangers carrying the process fluid. The method may further include controlling one or more outlet fan assemblies to discharge airflow heated by the cooling of the process fluid to the external environment to maintain a desired temperature in the enclosure space.

Those skilled in the art will appreciate the benefits of various additional embodiments reading the following detailed description of the embodiments with reference to the below-listed drawing figures. It is within the scope of the present disclosure that the above-discussed embodiments be provided both individually and in various combinations.

BRIEF DESCRIPTION OF THE DRAWINGS

According to common practice, the various features of the drawings discussed below are not necessarily drawn to scale. Dimensions of various features and elements in the drawings may be expanded or reduced to more clearly illustrate the embodiments of the disclosure.

FIG. 2 is a perspective view of an enclosure assembly according to an embodiment of the disclosure.

FIG. 11 is a schematic diagram of a control circuit according to an embodiment of the disclosure.

Corresponding parts are designated by corresponding reference numbers throughout the drawings.

DETAILED DESCRIPTION

The embodiments of the present disclosure are directed to enclosure assemblies to enhance cooling of a hydraulic fracturing direct drive unit (DDU) during operation. The embodiments of the present disclosure may be directed to such enclosure assemblies for enhanced cooling of DDUs associated with high-pressure, high-power hydraulic fracturing operations.

Figure 1A:
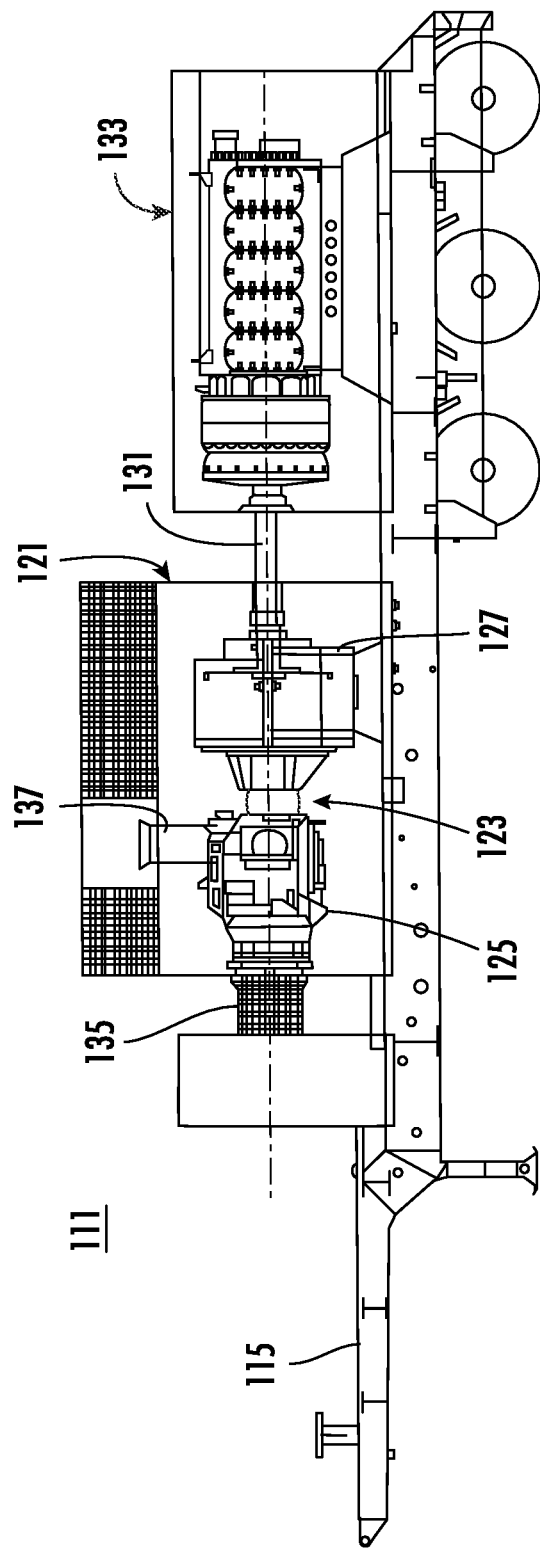
FIG. 1A is a schematic diagram of a pumping unit according to an embodiment of the disclosure.
Figure 1B:
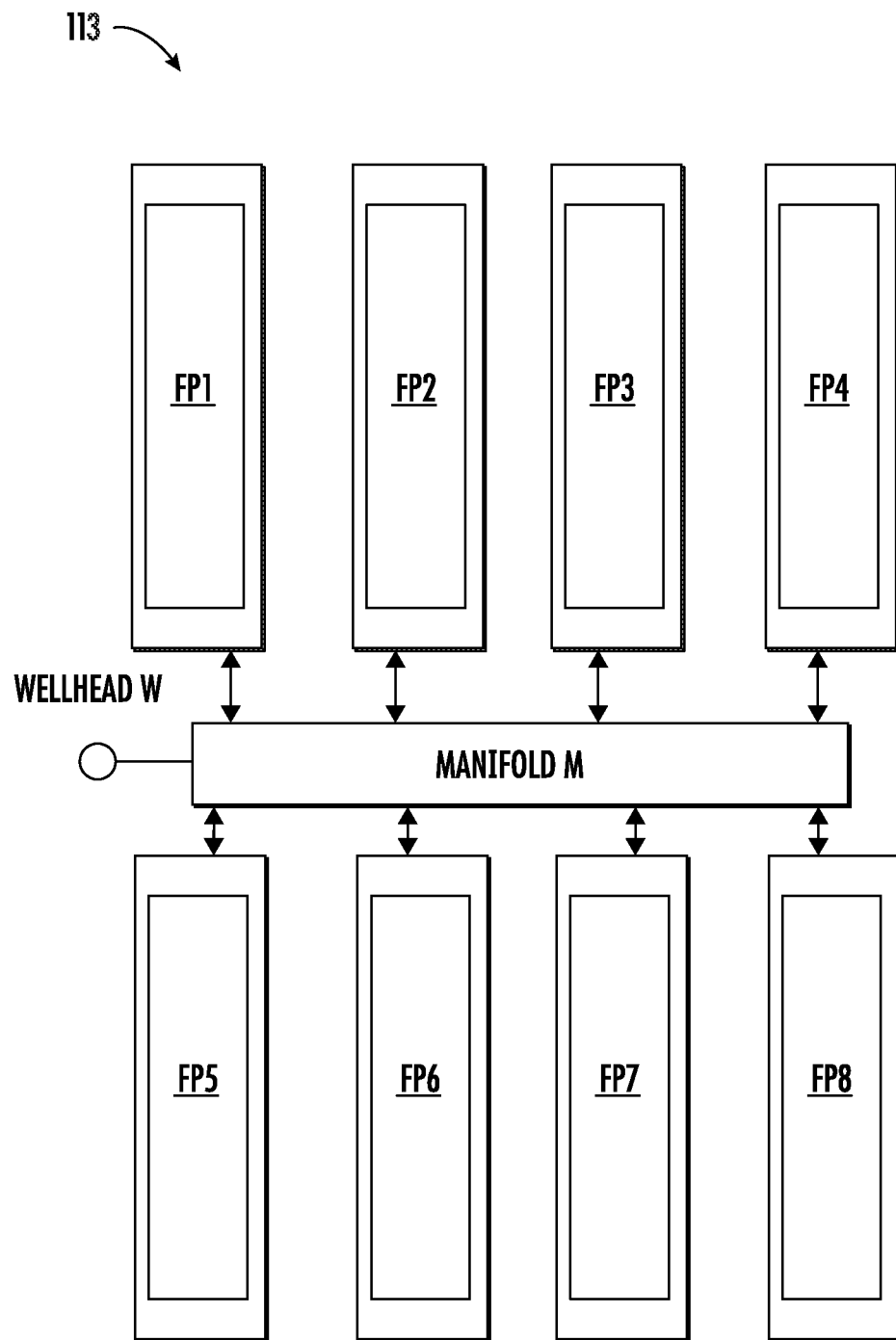
FIG. 1B is a schematic diagram of a layout of a fluid pumping system according to an embodiment of the disclosure.

FIG. 1A illustrates a schematic view of a pumping unit 111 for use in a high-pressure, high power, fluid pumping system 113 (FIG. 1B) for use in hydraulic fracturing operations according to an embodiment of the disclosure. FIG. 1B shows a typical pad layout of the pumping units 111 (indicated as FP1, FP2, FP3, FP4, FP5, FP6, FP7, FP8) with the pumping units all operatively connected to a manifold M that is operatively connected to a wellhead W.

By way of an example, the system 113 is a hydraulic fracturing application that may be sized to achieve a maximum rated horsepower of 24,000 HP for the pumping system 113, including a quantity of eight (8) 3000 horsepower (HP) pumping units 111 that may be used in one embodiment of the disclosure. It will be understood that the fluid pumping system 113 may include associated service equipment such as hoses, connections, and assemblies, among other devices and tools. As shown in FIG. 1A, each of the pumping units 111 are mounted on a trailer 115 for transport and positioning at the jobsite. Each pumping unit 111 includes an enclosure assembly 121 that houses a direct drive unit (DDU) 123 including a gas turbine engine 125 operatively connected to a gearbox 127 or other mechanical transmission.

The pumping unit 111 has a driveshaft 131 operatively connected to the gearbox 127. The pumping unit 111 includes a high-pressure, high-power, reciprocating positive displacement pump 133 that is operatively connected to the DDU 123 via the driveshaft 131. In one embodiment, the pumping unit 111 is mounted on the trailer 115 adjacent the DDU 123.

The trailer 115 includes other associated components such as a turbine exhaust duct 135 operatively connected to the gas turbine engine 125, air intake duct 137 operatively connected to the gas turbine, and other associated equipment hoses, connections, or other components as will be understood by those skilled in the art to facilitate operation of the fluid pumping unit 111.

In the illustrated embodiment, the gas turbine engine 125 may be a Vericor Model TF50F bi-fuel turbine; however, the DDU 123 may include other gas turbines or suitable drive units, systems, and/or mechanisms suitable for use as a hydraulic fracturing pump drive without departing from the disclosure. In one embodiment, the fluid pumping system 113 may include a turbine engine that uses diesel or other fuel as a power source. The gas turbine engine 125 is cantilever mounted to the gearbox 127, with the gearbox 127 supported by the floor of the enclosure assembly 121.

It should also be noted that, while the disclosure primarily describes the systems and mechanisms for use with DDUs 123 to operate fracturing pumping units 111, the disclosed systems and mechanisms may also be directed to other equipment within the well stimulation industry such as, for example, blenders, cementing units, power generators and related equipment, without departing from the scope of the disclosure.

Figure 4:
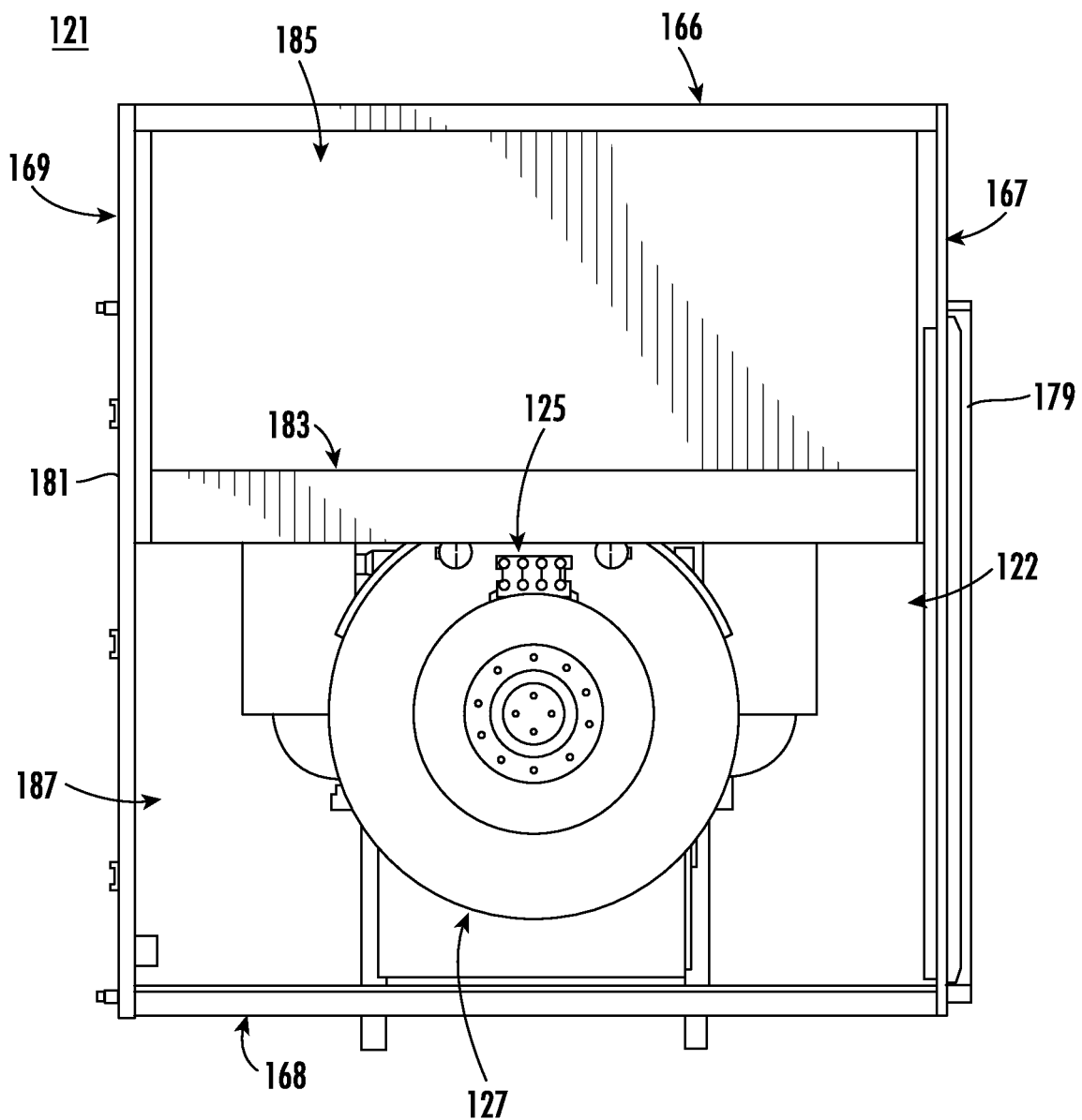
FIG. 4 is a schematic sectional view of an enclosure assembly according to an embodiment of the disclosure.

FIGS. 2 and 4 illustrate an enclosure assembly 121 that houses the DDU 123 according to an exemplary embodiment of the disclosure. As shown, the enclosure assembly 121 includes an enclosure body 165 that may extend at least partially around an enclosure space 122 to house one or more portion of the DDU 123 therein. The enclosure space 122 may also be sized and configured to accommodate other DDU/engine equipment, for example, a driveshaft interface, fuel trains, an exhaust system flanged connection, a fire suppression system, bulkheads, exhaust ducting, engine air intake ducting, hydraulic/pneumatic bulkhead hoses, inspection doors/hatches, or other components and equipment as will be understood by those skilled in the art.

In one embodiment, the enclosure body 165 may be a generally box-like or cuboid arrangement of walls, including a first side wall 167, a second side wall 169 opposite the first side wall 167, and an opposing front wall 171 and rear wall 173 each extending from the first side wall 167 to the second side wall 169. The enclosure body 165 may also include a roof/top wall 166 (FIG. 4) and a floor/bottom wall 168. In one embodiment, the floor 168 may be formed of a solid base steel material mounted on a skid structure.

Figure 3:
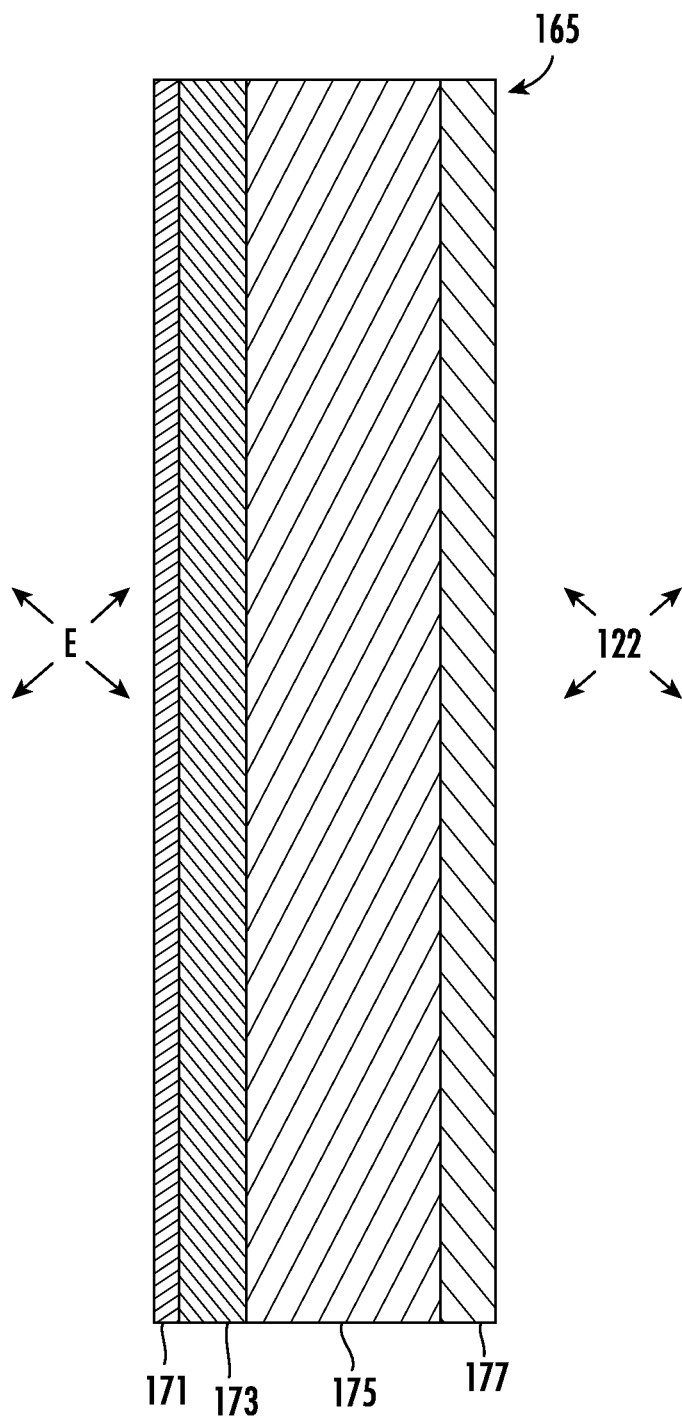
FIG. 3 is a schematic sectional view of an enclosure body according to an embodiment of the disclosure.

Referring additionally to FIG. 3, one or more of the walls of the enclosure body 165 may be provided with sound-attenuating, e.g., vibration-dampening, properties to minimize the transmission of sound from one or more operations of the DDU 123, e.g., running of the turbine engine 125 and/or the gearbox 127, from the enclosure space 122 to an external environment surrounding the enclosure body 165. In this regard, the walls of the enclosure body 165 may have a configuration in which multiple layers are arranged to provide sound attenuation. Other sound-attenuating features may be incorporated into the construction of the enclosure assembly 121. For example, the gearbox 127 may be provided with shock-absorbing feet or mounts that minimize the transmission of vibrations to the enclosure body 165.

In one embodiment, the walls of the enclosure body 165 may include an outer metallic layer 171, a foam or other polymeric layer 173 and a composite layer 175, and in inner or liner metallic layer 177, with the foam layer 173 and the composite layer 175 positioned between the metallic layers 171, 177.

In one embodiment, the walls 167, 169, 171, 173 of the enclosure body 165 may be formed from approximately 12"×12" panels with an overall thickness of about 4.5" to about 5.25" that may clip, snap, or otherwise connect together in a generally modular arrangement, and the outer metallic layer 171 may be, for example, a 22*ga* perforated aluminum sheet, the foam layer 173 may be, for example, a 1" foam layer, the composite layer 175 may be, for example, a 3"-4" layer of mineral wool, and the inner metallic layer 177 may be, for example, perforated 22*ga* aluminum. The roof 166 of the enclosure body 165 may have a similar arrangement, with an overall thickness of, for example, about 2" and having the foam layer 173 at a thickness of about, for example, 1.5". The enclosure body 165 may have a different arrangement without departing from the disclosure.

Still referring to FIG. 2, a plurality of doors may be movably connected/attached to the enclosure body 165, e.g., to provide access to the enclosure space 122 for inspections, maintenance, or other operations as will be understood by those skilled in the art. A pair of doors 179 may be hingably connected/attached to the first side wall 167 of the enclosure body 165 to provide access to the enclosure space 122 through openings formed in the first side wall 167 upon movement of the doors 179.

A door 181 may also be movably connected to the second side wall 169 of the enclosure body 165 to provide access to the enclosure space 122 along the second side wall 169. In one embodiment, the door 181 may be slidably connected/attached to the second side wall 169 on rails, tracks, or other guides as will be understood by those skilled in the art, such that slidable movement of the door 181 exposes an opening in the second side wall 169 through which an operator may access the enclosure space 122. In one embodiment, the door 181 may have one or more foldable or otherwise reconfigurable portions.

With additional reference to FIG. 4, a generally horizontal partition 183 may extend in general parallel relation with the roof 166 and the floor 168 of the enclosure body 165 so as to provide an upper compartment 185 and a lower compartment 187 of the enclosure space 122. In one embodiment, the upper compartment 185 may include an air intake assembly that may include an arrangement of ducts, fans, ports, filtration assemblies, blowers, compressors, cooling coils, or other components as will be understood by those skilled in the art, to feed filtered air into the turbine engine 123 positioned in the lower compartment 187.

In view of the foregoing, the enclosure assembly 121 may be provided with a generally weatherproof or weather-resistant configuration that is sufficiently robust for use in hydraulic fracturing applications, and which additionally provides sound attenuation properties for enclosed and associated equipment. For example, the enclosure assembly 121 may provide sufficient sound attenuation emanating from one or more incorporated heat exchanger assemblies, as described further herein.

During various operations of the pumping unit 133, e.g., startup and shutdown procedures, idling, maintenance cycles, active driving of the pumping unit 133, or other operations as will be understood by those skilled in the art, heat may be generated in one or more portions of the pumping unit 133, for example, via frictional engagement of components of the pumping unit 133 such as pistons, bores, or other components as will be understood by those skilled in the art. In this regard, the pumping unit 133 may employ a fluid heat transfer medium, e.g., a natural or synthetic lubrication oil, to absorb heat from the pumping unit 133 via fluid convection to reduce heat in one or more portions of the DDU 123.

Similarly, during various operations of the DDU 123, heat may be generated by one or more portions of the turbine engine 125 and the gearbox 127. The DDU 123 may thus also employ a fluid heat transfer medium to absorb heat from the DDU 123 via fluid convection to reduce heat in one or more portions of the DDU 123.

Further, various hydraulic components of the fluid pumping system 113, e.g., actuators, motors, pumps, blowers, coolers, filters, or other hydraulic components as will be understood by those skilled in the art, that receive pressurized hydraulic fluid or working fluid therethrough may cause such hydraulic fluid/working fluid to increase in temperature during the course of such operation.

The aforementioned fluid heat transfer media, hydraulic fluids/working fluids, and other thermally conductive fluids associated with the fluid pumping system 113 may be collectively referred to as process fluids associated with the respective components of the fluid pumping system 113 herein.

Figure 5:
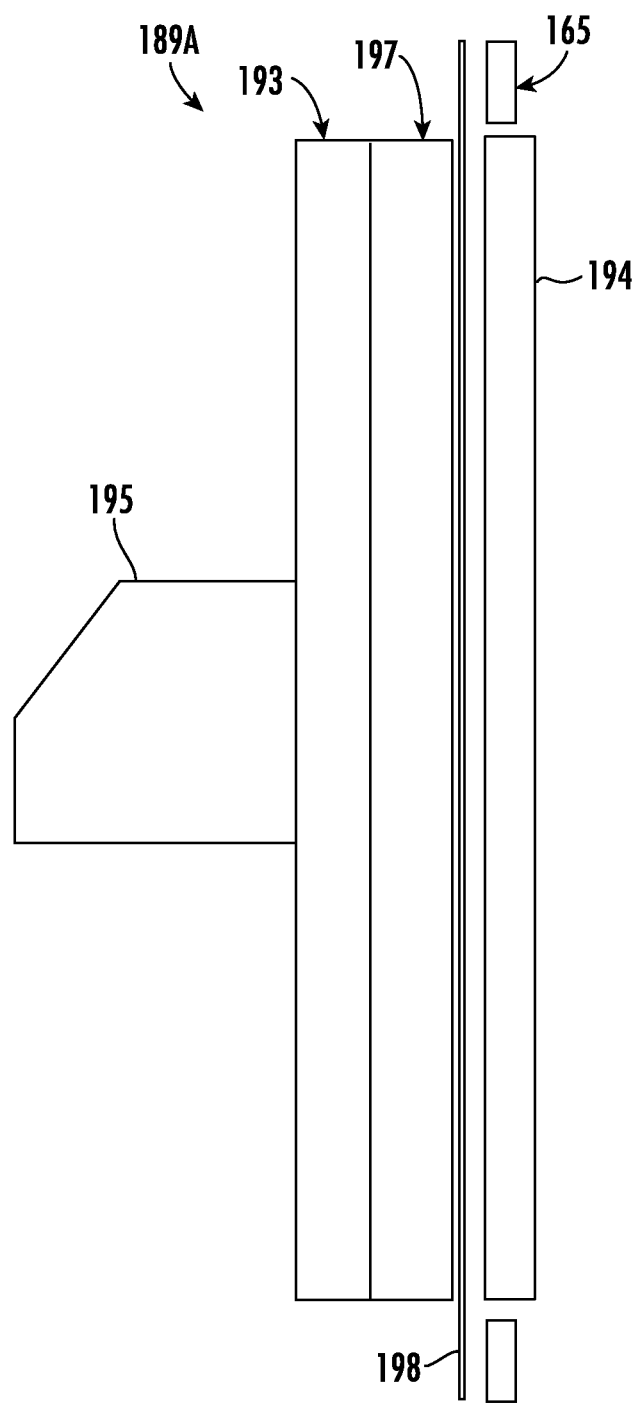
FIG. 5 is a schematic diagram of a heat exchanger assembly according to an embodiment of the disclosure.

In this regard, the fluid pumping system 113 may include one or more heat exchanger assemblies for cooling/reducing heat in the aforementioned process fluids. Turning to FIG. 5, a heat exchanger assembly 189A according to an exemplary embodiment of the disclosure is schematically illustrated. In the illustrated embodiment, the heat exchanger assembly 189A may be connected to, e.g., attached, mounted, or otherwise supported by, the enclosure body 165. While the heat exchanger assembly 189A is illustrated as being positioned in the enclosure space 122, it will be understood that the heat exchanger assembly 189A may be connected to the enclosure body 165 and at least partially positioned outside thereof without departing from the disclosure.

Still referring to FIG. 5, the heat exchanger assembly 189A may include one or more intake fan assemblies 193, one or more intake fan motors 195 operatively connected to the intake fan assembly 193, and one or more radiator assemblies 197 positioned adjacent the intake fan assembly 193. The heat exchanger assembly 189A may be positioned in alignment with a cutout or opening in the enclosure body 122, e.g., so that the heat exchanger assembly 189A may be in at least partial fluid communication with an external environment E surrounding the enclosure assembly 121. In one embodiment, such cutout or opening may be at least partially covered with a mounting plate 194 which may be connected to the heat exchanger assembly 189A.

A sealing member 198, for example, a gasket or other polymeric member, may be positioned between the heat exchanger assembly 189A and the enclosure body 165, for example, to inhibit the migration or leakage of fluids between the heat exchanger assembly 189A and the enclosure body 165.

The one or more intake fan assemblies 193 may include one or more fans 205 (FIG. 6) rotatably connected to the intake fan motor 195 such that, upon receiving a driving signal or other modality of actuation, the intake fan motor 195 rotates the one or more fans 205 to rotate and circulate air through the enclosure space 122. Such rotatable connection between the intake fan motor 195 and the fan 205 may be a driveshaft, coupling, or other mechanical transmission. The fan 205 may have a plurality of blades/arms for forcing/urging air into an airflow. In this regard, the fan 205 may be provided with blades/arms having a length, pitch, shape, or other features as will be understood by those skilled in the art, configured to influence airflow in a preselected direction.

As shown, the one or more radiator assemblies 197 is positioned adjacent the intake fan assembly 193. In one embodiment, the radiator assembly 197 may be configured as a tube-and-shell heat exchanger, in which one or more conduits (e.g., tubes, ducts, hoses, fluid lines, or other conduits as will be understood by those skilled in the art) extend along bulkhead fittings on the enclosure body 122 and through an interior of a housing shell 207 to route the process fluid over a sufficient surface area to effect cooling of the process fluid.

The conduits extending through the housing shell 207 may carry process fluid in the form of a fluid heat exchange medium, hydraulic fluid/working fluid, or other fluid. As described further herein, the radiator assembly 197 may be positioned in an airflow path at least partially provided by the intake fan assembly 193 to remove heat from the process fluid running through the conduits. In one embodiment, the radiator assembly 197 may be covered by/positioned adjacent one or more layers of mesh or otherwise porous material.

Figure 6:
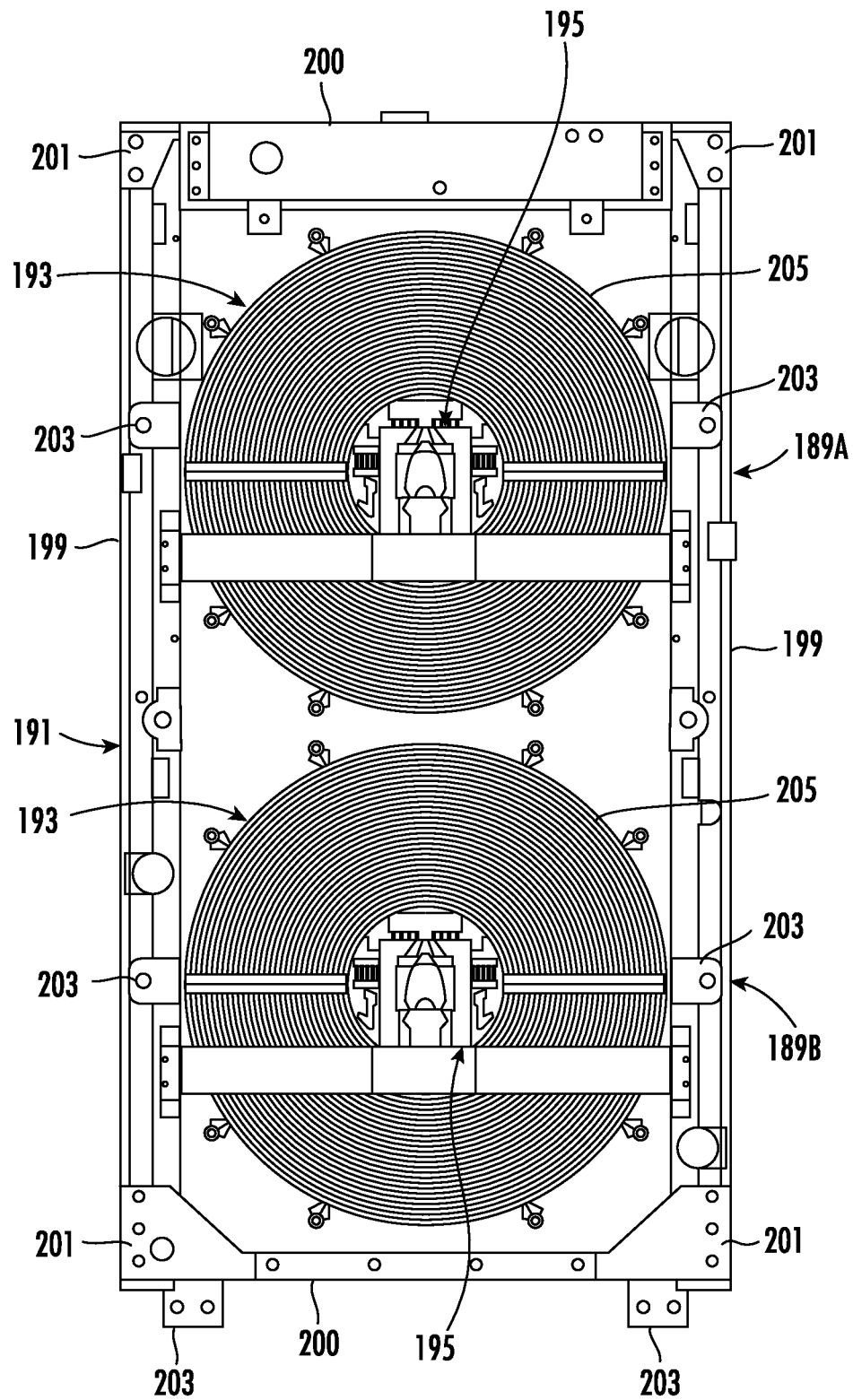
FIG. 6 is a front view of a heat exchanger assembly according to an embodiment of the disclosure.
Figure 7:
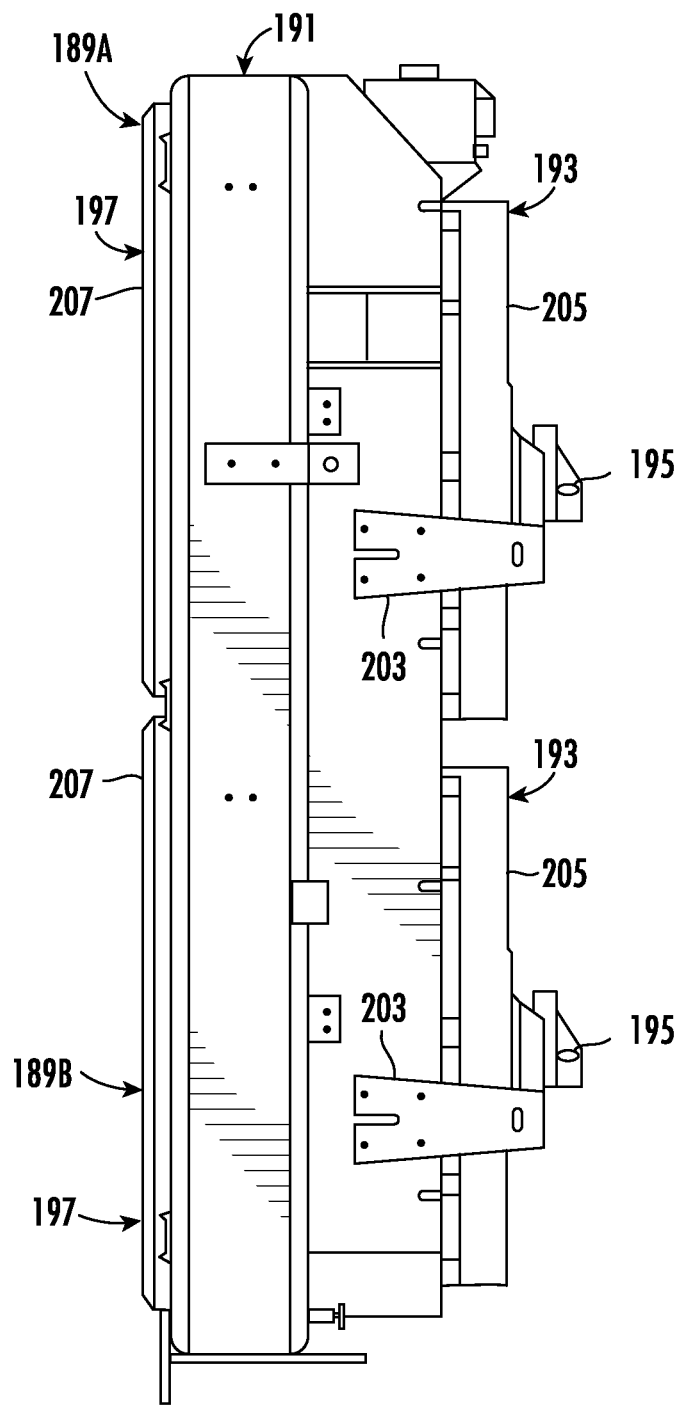
FIG. 7 is a side view of a heat exchanger assembly according to an embodiment of the disclosure.

Referring to FIGS. 6 and 7, the enclosure assembly 121 may include the heat exchanger assembly 189A (broadly, "low-pressure heat exchanger assembly 189A) for cooling process fluid received from a low-pressure portion of the fluid pump 133, and the enclosure assembly 121 may further include a high-pressure heat exchanger assembly 189B for cooling process fluid received from a high-pressure portion of the fluid pump 133. The heat exchanger assembly 189B may be similarly configured to the heat exchanger assembly 189A, though the heat exchanger assemblies 189A, 189B may have one or more differences without departing from the disclosure.

As also shown, the heat exchanger assemblies 189A, 189B are supported on a mounting frame 191 with a generally rigid body having outer frame members 199, 200 intersecting at respective joints/plates 201 that may be secured with fasteners such as bolts, screws, rivets, pins, or other fasteners as will be understood by those skilled in the art. As also shown, the mounting frame 191 is provided with one or more flanges or securing tabs 203 extending from one or more of the frame members 199, 200 and that are configured for engagement with the enclosure body 165. In this regard, the securing tabs 203 may have, for example, a generally flat or planar profile and/or may be provided with an opening for receiving a fastener therethrough. In one embodiment, the securing tabs 203 may be integrally formed with one or more of the frame members 199, 200.

The heat exchanger assemblies 189A, 189B may both be connected to the mounting frame 191 in a vertically stacked arrangement, as shown, though each heat exchanger assembly 189A, 189B may be connected to the enclosure body 165 on separate mounting frames without departing from the disclosure. In one embodiment, the mounting frame 191 may be about 0.25" thick, and may be provided with a tolerance of about 0.1" to about 0.2" beyond the boundaries of the heat exchanger assemblies 189A, 189B.

In one embodiment, the mounting frame 191 may be connected to a modular panel of the side wall 167 that is sized and configured to an area larger than that of the heat exchanger assemblies 189A, 189B. In one embodiment, such modular panel may be provided with a tolerance of about 0.35" to about 0.45" beyond the heat exchanger assemblies 189A, 189B.

In one embodiment, and as shown in FIG. 2, the enclosure assembly 121 may include additional or alternative heat exchangers, for example, a heat exchanger 189C for cooling process fluid associated with the turbine engine 125, a heat exchanger 189D for cooling process fluid associated with the gearbox 127, and a heat exchanger 189E for cooling process fluid associated with one or more hydraulic components of the fluid pumping system 113 (e.g., auxiliary/ancillary actuators, pumps, motors, or other hydraulic components as will be understood by those skilled in the art). It will be understood that each of the heat exchanger assemblies 189A, 189B, 189C, 189D, 189E may be sized/scaled/configured according to the process fluids upon which they are operative to cool.

As described herein, the heat exchanger assemblies 189C, 189D, 189E may have a configuration that is substantially similar to that of the heat exchanger assemblies 189A and 189B, though one or more of the heat exchanger assemblies 189A, 189B, 189C, 189D, 189E may have a different configuration without departing from the disclosure. By way of example, two or more of the one or more of the heat exchanger assemblies 189A, 189B, 189C, 189D, 189E may share a common mounting frame, housing shell, intake fan assembly, or other component as will be understood by those skilled in the art.

As shown in FIG. 2, the heat exchanger assemblies 189A, 189B, 189C, 189D, 189E are connected to the enclosure body 165 and positioned in fluid communication with the external environment E such that when the respective intake fan assemblies 193 are driven by the respective intake fan motors 195, the intake fan assemblies 193 are operative to draw air in from the external environment E toward the respective radiator assemblies 197 to remove heat/cool the process fluids flowing therethrough, and so that they may return to respective portions of the fluid pumping system for continued lubrication/cooling of components of the fluid pumping system 113.

The aforementioned action of the intake fan assemblies 193 causes air from the external environment E to absorb heat from the radiator assemblies 197 as it passes thereby/therethrough and further into the enclosure space 122. In this regard, operation of one or more of the heat exchanger assemblies 189A, 189B, 189C, 189D, 189E may cause an ambient temperature in the enclosure space 122 of the enclosure assembly 121 to increase.

Figure 8:
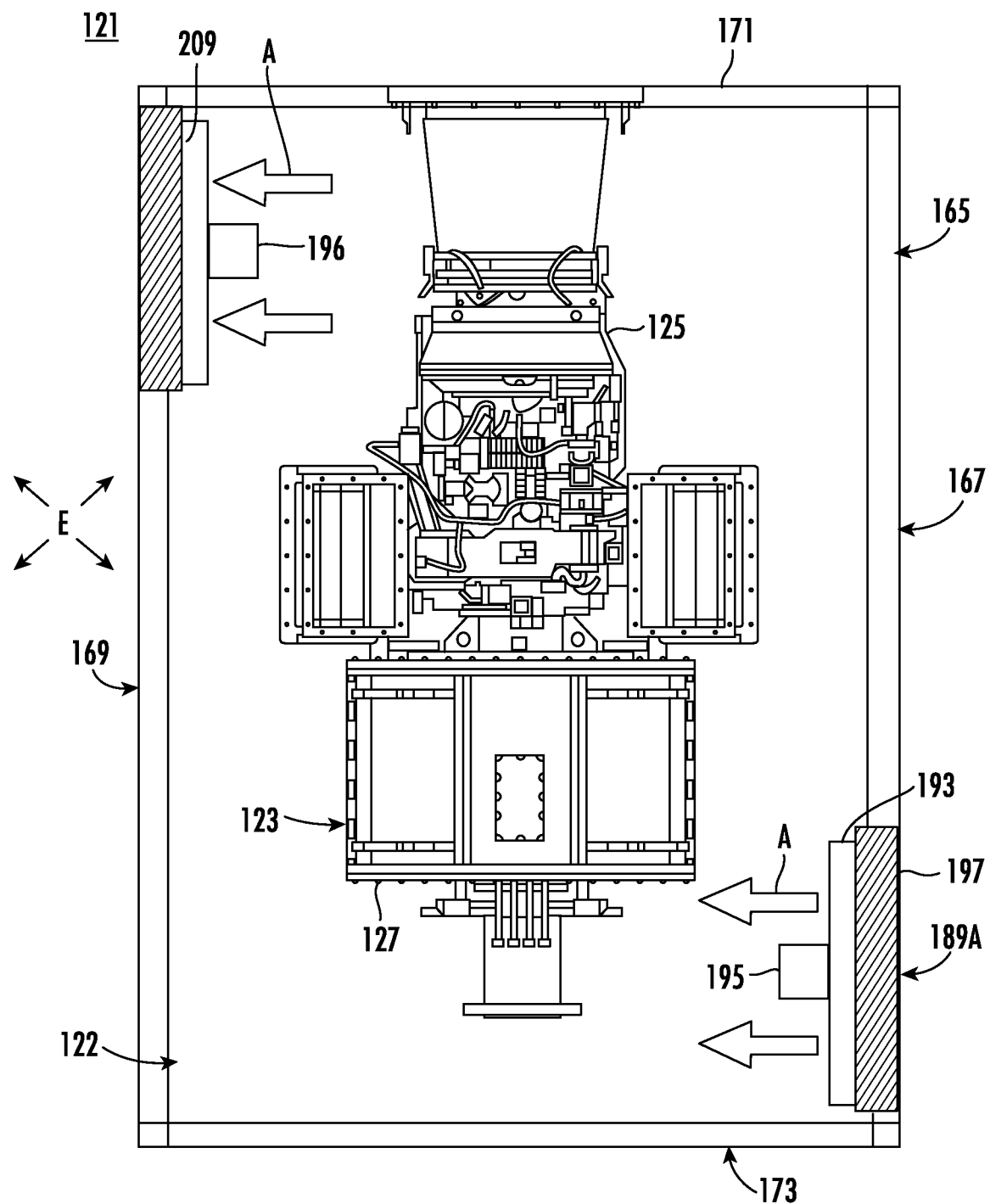
FIG. 8 is a plan sectional view of an enclosure assembly according to an embodiment of the disclosure.
Figure 9:
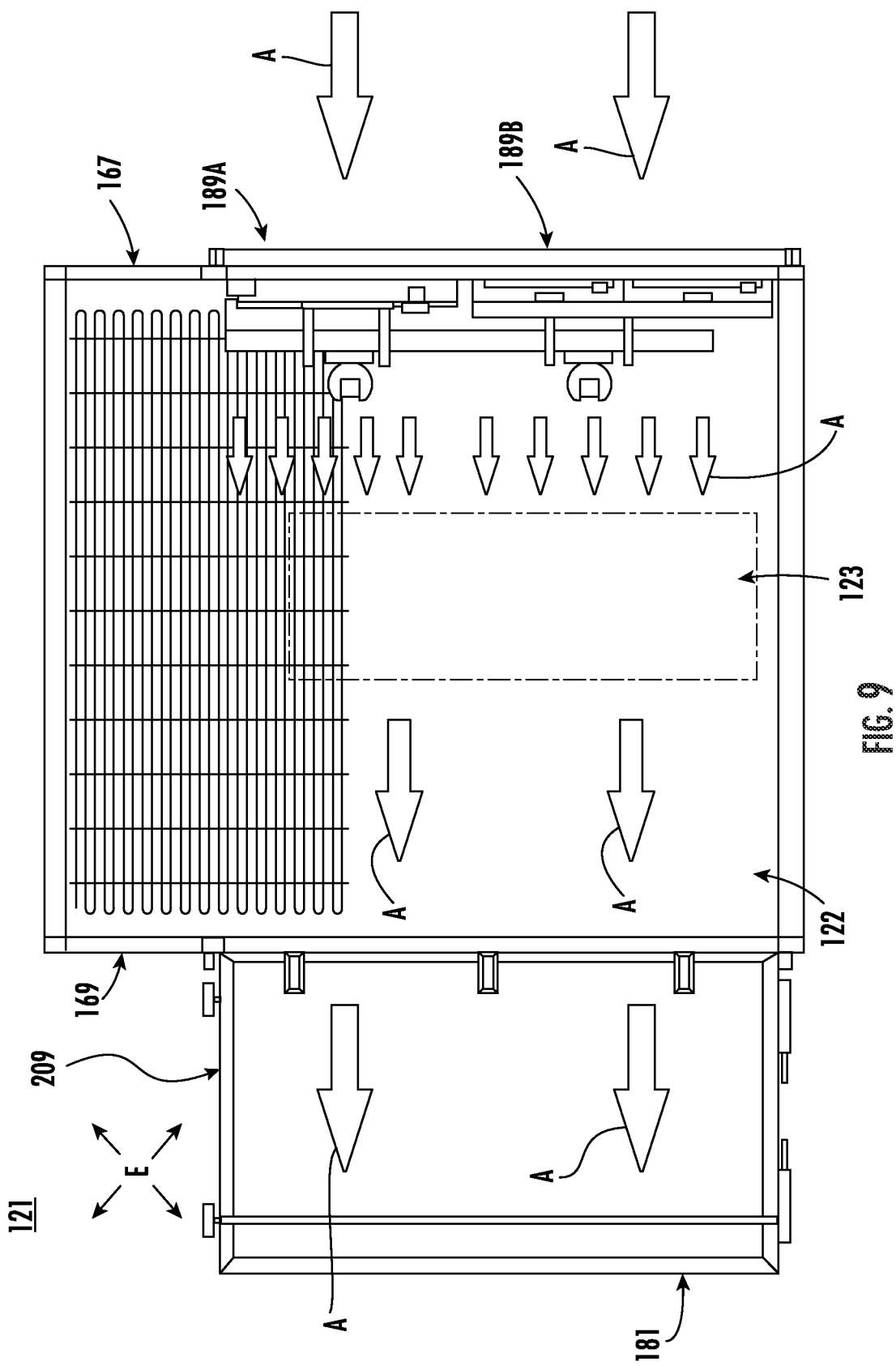
FIG. 9 is a side sectional view of an enclosure assembly according to an embodiment of the disclosure.

With additional reference to FIGS. 8 and 9, one or more outlet/suction fan assemblies 209 may also be connected to the enclosure body 165. The one or more outlet fan assemblies 209 may have a similar configuration to the aforementioned intake fan assemblies 193, in that they may include one or more outlet fans, e.g., a fan 205, in operative communication with one or more respective motors, e.g., an outlet fan motor 196, such that upon receiving a driving signal or actuation force, the outlet fan motor 196 may drive the fan 205 to rotate. In one embodiment, the outlet fan assembly 209 may include a pair of fans 205 driven by one or more outlet fan motors 196. It will be understood that the one or more inlet fan assemblies 193 and the one or more outlet fan assemblies 209 may be driven by the same motor or combination of motors. Although the one or more outlet fan assemblies 209 has been described herein separately from the heat exchanger assemblies 189A, 189B, 189C, 189D, 189E, it will be understood that one or more of the heat exchanger assemblies 189A, 189B, 189C, 189D, 189E may include the one or more outlet fan assemblies 209 without departing from the disclosure.

In one embodiment, one or more of the heat exchanger assemblies 189A, 189B, 189C, 189D, 189E may be attached to the first side wall 167 of the enclosure body 165, and the outlet fan assembly 209 may be attached to the second side wall 169 of the enclosure body 165. It will be understood that the heat exchanger assemblies 189A, 189B, 189C, 189D, 189E and the outlet fan assembly 209 may be attached to the enclosure body 165 in a different arrangement without departing from the disclosure.

In this regard, upon receipt of an actuation force or driving signal, the one or more outlet fan motors 196 associated with the outlet fan assembly 209 may rotate the fan 205 to discharge air from the enclosure space 122 to the external environment E. Accordingly, the arrangement of the heat exchanger assemblies 189A, 189B, 189C, 189D, 189E and the outlet fan assembly 209 is operative to draw atmospheric/cool air in from the external environment E at the intake fan assembly 193, direct airflow toward the radiator assembly 197 to cool the process fluids flowing therethrough, and, further, to ventilate the enclosure assembly 121 by directing an airflow path A from the intake fan assembly 193 to the outlet fan assembly 209 and discharging the air from the enclosure space 122/airflow path A that has been heated from cooling the radiator assembly 197 to the external environment E at the outlet fan assembly 209.

Still referring to FIGS. 8 and 9, in one embodiment, one or more of the heat exchanger assemblies 189A, 189B, 189C, 189D, 189E, in cooperation with the one or more outlet fan assemblies 209, is configured to replace a volume of air in the enclosure space 122 at an interval of about 30 seconds. It will be understood that the heat exchanger assemblies may be configured to replace the same or a different volume of air at a different time interval without departing from the disclosure.

Accordingly, the enclosure assembly 121 may be provided with enhanced cooling capabilities for managing excess heat generated by one or more of the DDU 123, the fluid pump 113, and various hydraulic components associated with the fluid pumping system 113. As described above, one or more of the heat exchanger assemblies 189A, 189B, 189C, 189D, 189E is operative to cool process fluid associated with one or more of the DDU 123, the fluid pump 113, and various hydraulic components associated with the fluid pumping system 113. Further, the intake fan assemblies 193 of the heat exchanger assemblies 189A, 189B, 189C, 189D, 189E direct the airflow path A through the enclosure space 122 such that, in cooperation with the outlet fan assembly 209, the air in the enclosure space 122 may be discharged to the external environment E to provide ventilation in the enclosure space 122. Such ventilation may, for example, maintain a desired temperature of the enclosure space 122, e.g., to further enhance a temperature differential between the airflow path A and the process fluid in the heat exchanger assemblies 189A, 189B, 189C, 189D, 189E.

As described herein, one or more of the motors 195, 196 may be hydraulic motors, e.g., such that a pressurized working fluid/hydraulic fluid flows therethrough to actuate the motors 195, 196.

Figure 10:
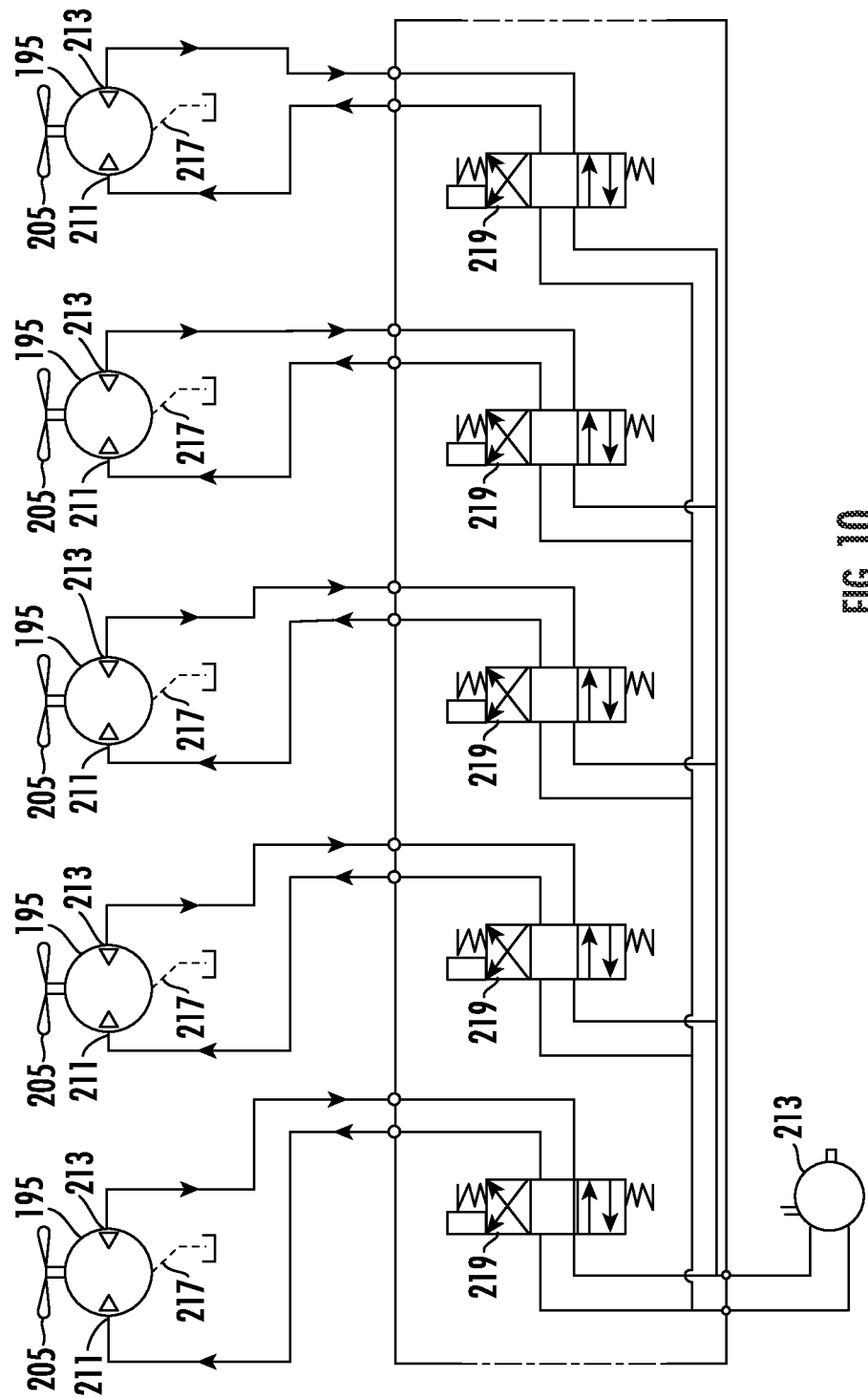
FIG. 10 is a schematic diagram of a hydraulic circuit according to an embodiment of the disclosure.

With additional reference to FIG. 10, a schematic diagram is provided to show a hydraulic circuit that may be used to drive one or more of the fans 205 of the respective intake fan assemblies 193. As shown, each intake fan motor 195 includes an inlet port 211 in fluid communication with a hydraulic pump 213 to receive pressurized fluid from the hydraulic pump 213 to actuate the respective intake fan motor 195. The intake fan motors 195 are also in fluid communication with a return port or outlet port 215 in fluid communication with the hydraulic pump 213 to return hydraulic fluid/working fluid to the respective hydraulic pump 213 after it has passed through/actuated the respective intake fan motor 195. Each intake fan motor 195 may also include a drain port 217 in fluid communication therewith, for example, to provide drainage of overflow/excess hydraulic fluid/working fluid, to provide a leakage path or pressure release, or other fluid release as will be understood by those skilled in the art. It will be understood that the one or more outlet fan motors 196 may be arranged/controlled in a manner similar to that described above with regard to the inlet fan motors 195.

It will be understood that the hydraulic pump 213 may be in fluid communication with the respective fluid pump 133, the turbine engine 125, the gearbox 127, and one or more hydraulic components of the fluid pumping system 113 to receive and return process fluid thereto, for example, through an arrangement of fluid lines, manifolds, valves, or other fluid conduit as will be understood by those skilled in the art. In one embodiment, each of the fluid pump 133, the turbine engine 125, the gearbox 127, and one or more hydraulic components of the fluid pumping system 113 may be associated with a separate hydraulic pump 213, or a combination of hydraulic pumps 213. In one embodiment, the motors 195 associated with the respective low-pressure portion of the fluid pump 133 and the high-pressure portion of the fluid pump 133 may share one or more common fluid lines.

Each intake fan motor 195 may have an associated solenoid 219 that includes one or more fluid valves to control the flow of hydraulic fluid/working fluid thereto and therefrom. For example, upon receipt of a predetermined electrical signal, each solenoid 219 may actuate, e.g., open or dilate, to permit the flow of hydraulic fluid/working fluid from the hydraulic pump 213 to the respective inlet port 211 and to permit the flow of hydraulic fluid/working fluid from the respective outlet portion 215 to the hydraulic pump 213. Similarly, the solenoid 219 may close, e.g., restrict or block, the flow of hydraulic fluid/working fluid therethrough upon receipt of a predetermined electrical signal, e.g., a closure signal.

While the intake fan motors 195 described herein have been described as hydraulic motors driven by pressurized hydraulic/working fluid, it will be understood that one or more of the motors 195 (or the motors 196) may be an electric motor driven by a received electrical actuation/driving signal. In one embodiment, one or more of the motors 195, 196 may be an electric motor powered from 3-phase electrical power provided by an onboard generator system capable of a voltage output of 480V.

Turning to FIG. 11, a schematic diagram of a control system that may be used to control the inlet fan motors 195 is illustrated. As shown, each solenoid 219 may be electrically connected to a controller 221, e.g., a programmable logic controller (PLC), an off-highway multi-controller, a processor-implemented controller, or other control feature as will be understood by those skilled in the art. In this regard, the controller 221 may be operable to actuate the solenoids 219, e.g., to selectively open and close the valves of the solenoid 219 to permit/restrict the flow of hydraulic fluid/working fluid through the respective inlet fan motors 195. It will be understood that the one or more outlet fan motors 196 may be controlled in a manner similar to that described above with regard to the inlet fan motors 195.

In this regard, the controller 221 may be configured to transmit a driving or actuation signal to the respective solenoids 219 upon receipt of a predetermined electrical signal from a thermal/temperature sensor 223 that may be in proximity to the process fluid associated with the respective turbine engine 125, gearbox 127, low-pressure portion of the pump 133, the high-pressure portion of the pump 133, and one or more hydraulic components of the fluid pumping system 113. In this regard, one or more temperature sensors 223 may be connected to the enclosure assembly 121 or components thereof. In one embodiment, the sensors 223 may be disposed along a fluid line between the outlet port/return portion 215 of the respective motor 195 and the hydraulic pump 213 and/or a respective reservoir for the process fluid carried therethrough.

In one embodiment, the sensors 223 may be digital thermometers or another electronic sensor that may receive/absorb heat from the associated respective turbine engine 125, gearbox 127, low-pressure portion of the pump 133, the high-pressure portion of the pump 133, and one or more hydraulic components of the fluid pumping system 113, and transmit a corresponding electrical signal to the controller 221. If the respective electrical signal corresponds to a temperature that is at or above a predetermined value or threshold, for example, set by regulation or OEMs, the controller 221 may signal the respective solenoid 219 to open the respective valves.

It will be understood that such actuation of the solenoids 219 may be performed at a constant or predetermined time interval, on-demand, e.g., if and when a predetermined signal is received from the sensors 223, and/or may be performed proportionally to the temperature of the enclosure space 122, e.g., so that determining and monitoring greater/lesser temperatures in the enclosure space 122, the controller 221 will proportionally increase/decrease the flow rate of hydraulic/working fluid flowing through the respective intake fan motors 195, and consequently, the speed of the respective associated fans 205.

In one embodiment, one or more of the sensors 223 may include an analog device configured to receive/absorb heat and product a corresponding analog electrical signal without any intermediate processing steps, for example, as in a thermocouple, resistance temperature detector (RTD), or temperature switch. Such analog electrical signal may be a raw value determined by the controller 221 or other processor to correspond to a temperature of the enclosure space 122.

While the hydraulic circuit and control of the respective fans 205 has been described above with regard to the heat exchanger assemblies 189A, 189B, 189C, 189D, 189E, it will be understood that the fans 205 of the outlet fan assembly 209 may be driven and controlled in the same or a similar manner.

Still other embodiments of the disclosure, as shown in FIGS. 1-11, also include methods of enhancing cooling during operation of a hydraulic fracturing direct drive unit (DDU) having a turbine engine mechanically connected to a gearbox. An embodiment of a method may include operating the DDU to drive a driveshaft operatively connected to a fluid pump such that one or more of the turbine engine and the fluid pump generates and heats process fluid, for example, a lubrication or other lubrication medium, and/or a hydraulic/working fluid. The method may include detecting a temperature in an enclosure space of an enclosure assembly housing the DDU with one or more temperature sensors, and, further, controlling one or more intake fan assemblies of one or more heat exchanger assemblies in the enclosure space to draw air from an external environment into an airflow through the enclosure space based upon a temperature signal detected by the one or more temperature sensors. In this regard, the method may include cooling the process fluid by directing airflow from the one or more intake fan assemblies toward one or more radiator assemblies of the one or more heat exchangers carrying the process fluid. The method may further include controlling one or more outlet fan assemblies to discharge airflow heated by the cooling of the process fluid to the external environment to maintain a desired temperature in the enclosure space.

In view of the foregoing, the disclosed embodiments of enclosure assemblies for DDUs may provide for enhanced cooling by the configuration and arrangement of one or more heat exchangers that cool one or more process fluids associated with the DDU and/or an associated fluid pumping system while also providing ventilation and cooling of an enclosure space within the enclosure assembly. In addition to the enhanced cooling of the DDU provided by such an arrangement, the footprint of the enclosure assembly may be minimized and the management of associated power systems may be streamlined.

This is a divisional of U.S. Non-Provisional application Ser. No. 17/302,039, filed Apr. 22, 2021, titled "ENCLOSURE ASSEMBLY FOR ENHANCED COOLING OF DIRECT DRIVE UNIT AND RELATED METHODS," which claims priority to and the benefit of, under 35 U.S.C. § 119(e), U.S. Provisional Application No. 62/705,042, filed Jun. 9, 2020, titled "ENCLOSURE ASSEMBLY FOR ENHANCED COOLING OF DIRECT DRIVE UNIT AND RELATED METHODS," and U.S. Provisional Application No. 62/704,981, filed Jun. 5, 2020, titled "ENCLOSURE ASSEMBLY FOR ENHANCED COOLING OF DIRECT DRIVE UNIT (DDU) AND RELATED METHODS," the disclosures of which are incorporated herein by reference in their entireties.

The foregoing description of the disclosure illustrates and describes various exemplary embodiments. Various additions, modifications, and changes may be made to the exemplary embodiments without departing from the spirit and scope of the disclosure. It is intended that all matter contained in the above description or shown in the accompanying drawings shall be interpreted as illustrative and not in a limiting sense. Additionally, the disclosure shows and describes only selected embodiments of the disclosure, but the disclosure is capable of use in various other combinations, modifications, and environments and is capable of changes or modifications within the scope of the inventive concept as expressed herein, commensurate with the above teachings, and/or within the skill or knowledge of the relevant art. Furthermore, certain features and characteristics of each embodiment may be selectively interchanged and applied to other illustrated and non-illustrated embodiments of the disclosure.

What is claimed is:

1. An enclosure assembly to enhance cooling of a hydraulic fracturing direct drive unit (DDU) during operation, the enclosure assembly comprising: an enclosure body extending at least partially around an enclosure space to house the DDU, the DDU including a turbine engine mechanically connected to a gearbox for driving a driveshaft connected to the gearbox to drive a fluid pump; one or more or more heat exchanger assemblies connected to the enclosure body for cooling a process fluid associated with the DDU and the fluid pump, the one or more heat exchanger assemblies each including: one or more intake fan assemblies positioned in fluid communication with an external environment surrounding the enclosure body, one or more intake fan motors operatively connected to the one or more intake fan assemblies to draw air into the enclosure space from the external environment at the one or more intake fan assemblies and along an airflow path through the enclosure space when the one or more intake fan motors is activated, and one or more radiator assemblies for receiving the process fluid, the one or more radiator assemblies positioned adjacent the one or more intake fan assemblies in the airflow path through the enclosure space to cool the process fluid as it flows through the one or more radiator assemblies when the one or more intake fan motors is activated; one or more outlet fan assemblies positioned in fluid communication with the external environment, the one or more outlet fan assemblies operatively connected to one or more outlet fan motors to discharge air from the enclosure space to the external environment at the one or more outlet fan assemblies to maintain a desired temperature of the enclosure space when the one or more outlet fan motors is activated; one or more temperature sensors positioned to detect a temperature of the enclosure space; and one or more controllers in electrical communication with the one or more temperature sensors, the one or more controllers operatively connected to one or more of the one or more intake fan motors and the one or more outlet fan motors such that the one or more controllers activates the respective one or more intake fan motors and the one or more outlet fan motors to rotate the respective one or more intake fan assemblies and the one or more outlet fan assemblies and thereby cool the process fluid and maintain a desired temperature of the enclosure space responsive to a predetermined temperature signal from the one or more temperature sensors.

2. The enclosure assembly of claim 1, wherein each of the one or more intake fan assemblies and the one or more outlet fan assemblies includes one or more fans rotatably connected to the respective one or more intake fan motors and the one or more outlet fan motors to drive the respective one or more fans when the respective one or more intake fan motors and the one or more outlet fan motors is activated.

3. The enclosure assembly of claim 2, wherein the enclosure body includes a plurality of side walls, wherein the heat exchanger assembly is connected to a first side wall of the enclosure body and the one or more outlet fan assemblies is connected to a second side wall of the enclosure body such that the airflow path through the enclosure space extends from the one or more intake fan assemblies to the one or more outlet fan assemblies.

4. The enclosure assembly of claim 1, wherein each of the one or more intake fan motors and the one or more outlet fan motors includes one or more of a hydraulic motor and an electric motor.

5. The enclosure assembly of claim 1, wherein the one or more heat exchanger assemblies includes a fluid pump heat exchanger assembly for cooling process fluid associated with the fluid pump, and the enclosure assembly further includes one or more of a hydraulic heat exchanger assembly for cooling process fluid associated with one or more hydraulic components in operative communication with one or more of the DDU and the fluid pump, a gearbox heat exchanger assembly for cooling process fluid associated with the gearbox, and an engine lube heat exchanger assembly for cooling process fluid associated with the turbine engine.

6. The enclosure assembly of claim 5, wherein the fluid pump heat exchanger assembly includes a low-pressure fluid pump heat exchanger assembly for cooling process fluid associated with a low-pressure portion of the fluid pump, and the enclosure assembly further includes a high-pressure fluid pump heat exchanger assembly for cooling process fluid associated with a high-pressure portion of the fluid pump.

7. The enclosure assembly of claim 6, wherein the process fluid is one or more of a lubrication fluid for absorbing heat from the one of more of the DDU and the fluid pump and a hydraulic fluid for pressurizing the one or more hydraulic components in operative communication with one or more of the DDU and the fluid pump.

8. The enclosure assembly of claim 1, wherein the enclosure body includes a plurality of layers, one or more layers of the plurality of layers is configured to inhibit the transmission of sound from the DDU to the external environment surrounding the enclosure body.

9. The enclosure assembly of claim 8, wherein the plurality of layers includes an inner metallic layer, an outer metallic layer, and one or more foam layers and one or more wool layers positioned between the inner metallic layer and the outer metallic layer to dampen sound emanated from the DDU when the DDU is in operation.

10. The enclosure assembly of claim 1, wherein the one or more sensors includes one or more of an analog sensor configured to produce an analog electrical signal corresponding to a temperature of the enclosure space and a digital sensor configured to produce a digital electrical signal corresponding to a temperature of the enclosure space.

11. A fluid pumping system for high-pressure, high-power hydraulic fracturing operations, the fluid pumping system comprising: a direct drive unit (DDU) including a turbine engine mechanically connected to a gearbox for driving a driveshaft; a fluid pump operatively connected to the DDU by the driveshaft for driving the fluid pump, the DDU and the fluid pump generating process fluid during operation; an enclosure assembly including an enclosure body extending around an enclosure space to house the DDU; one or more heat exchanger assemblies connected to the enclosure body for cooling the process fluid, the one or more heat exchanger assemblies each including: one or more intake fan assemblies positioned in fluid communication with an external environment surrounding the enclosure body, one or more intake fan motors operatively connected to the one or more intake fan assemblies to draw air into the enclosure space from the external environment at the one or more intake fan assemblies and along an airflow path through the enclosure space when the one or more intake fan motors is activated, and one or more radiator assemblies for receiving the process fluid, the one or more radiator assemblies positioned adjacent the one or more intake fan assemblies in the airflow path through the enclosure space to cool the process fluid as it flows through the radiator assembly when the one or more intake fan motors is activated; one or more outlet fan assemblies positioned in the enclosure space and in fluid communication with the external environment, the one or more outlet fan assemblies operatively connected to one or more outlet fan motors to discharge air from the enclosure space to the external environment at the one or more outlet fan assemblies to maintain a desired temperature of the enclosure space when the one or more outlet fan motors is activated; one or more temperature sensors positioned to detect a temperature of the enclosure space; and one or more controllers in electrical communication with the one or more temperature sensors, the one or more controllers operatively connected to one or more of the one or more intake fan motors and the one or more outlet fan motors such that the one or more controllers activates the respective one or more intake fan motors and the one or more outlet fan motors to rotate the respective one or more intake fan assemblies and the one or more outlet fan assemblies and cool the process fluid and maintain a desired temperature of the enclosure space responsive to a predetermined temperature signal from the one or more temperature sensors.

12. The fluid pumping system of claim 11, wherein each of the one or more intake fan assemblies and the one or more outlet fan assemblies includes one or more fans rotatably connected to the respective one or more intake fan motors and the one or more outlet fan motors to drive the respective one or more fans when the respective one or more intake fan motors and the one or more outlet fan motors is activated.

13. The fluid pumping system of claim 12, wherein the enclosure body includes a plurality of side walls, wherein the heat exchanger assembly is connected to a first side wall of the enclosure body and the one or more outlet fan assemblies is connected to a second side wall of the enclosure body such that the airflow path through the enclosure space extends from the one or more intake fan assemblies to the one or more outlet fan assemblies.

14. The fluid pumping system of claim 11, wherein each of the respective one or more intake fan motors and one or more outlet fan motors includes one or more of a hydraulic motor and an electric motor.

15. The fluid pumping system of claim 11, wherein the one or more heat exchanger assemblies includes a fluid pump heat exchanger assembly for cooling process fluid associated with the fluid pump, and the enclosure assembly further includes one or more of a hydraulic heat exchanger assembly for cooling process fluid associated with one or more hydraulic components of the fluid pumping system, a gearbox heat exchanger assembly for cooling process fluid associated with the gearbox, and an engine lube heat exchanger assembly for cooling process fluid associated with the turbine engine.

16. The fluid pumping system of claim 15, wherein the fluid pump heat exchanger assembly includes a low-pressure fluid pump heat exchanger assembly for cooling process fluid associated with a low-pressure portion of the fluid pump, and the enclosure assembly further includes a high-pressure fluid pump heat exchanger assembly for cooling process fluid associated with a high-pressure portion of the fluid pump.

17. The fluid pumping system of claim 16, wherein process fluid is one or more of a lubrication fluid for absorbing heat from the one or more of the DDU and the fluid pump and a hydraulic fluid for pressurizing the one or more hydraulic components in operative communication with one or more of the DDU and the fluid pump.

18. The fluid pumping system of claim 11, wherein the enclosure body includes a plurality of layers, one or more layers of the plurality of layers is configured to inhibit the transmission of sound to the external environment surrounding the enclosure body.

19. The fluid pumping system of claim 18, wherein the plurality of layers includes an inner metallic layer, an outer metallic layer, and one or more foam layers and one or more wool layers positioned between the inner metallic layer and the outer metallic layer to dampen sound emanated from the DDU when the DDU is in operation.

20. The fluid pumping assembly of claim 11, wherein the one or more sensors includes one or more of an analog sensor configured to produce an analog electrical signal corresponding to a temperature of the enclosure space and a digital sensor configured to produce a digital electrical signal corresponding to a temperature of the enclosure space.

\* \* \* \* \*